US012796221B2

(12) United States Patent
Liu et al.

(10) Patent No.: US 12,796,221 B2
(45) Date of Patent: Nov. 10, 2026

(54) LIGHT EMITTING SUBSTRATE HAVING AUXILIARY PIXEL DRIVING CIRCUIT, DISPLAY PANEL, DISPLAY APPARATUS, AND DISPLAY METHOD

(71) Applicant: BOE Technology Group Co., Ltd., Beijing (CN)

(72) Inventors: Weixing Liu, Beijing (CN); Wanpeng Teng, Beijing (CN); Tieshi Wang, Beijing (CN); Chunfang Zhang, Beijing (CN); Kai Guo, Beijing (CN); Xiaolong Li, Beijing (CN); Zhiqiang Xu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 853 days.

(21) Appl. No.: 18/041,070

(22) PCT Filed: Mar. 22, 2022

(86) PCT No.: PCT/CN2022/082308

§ 371 (c)(1),
(2) Date: Feb. 8, 2023

(87) PCT Pub. No.: WO2023/178520

PCT Pub. Date: Sep. 28, 2023

(65) Prior Publication Data

US 2024/0268149 A1 Aug. 8, 2024

(51) Int. Cl.
*H10K 59/121* (2023.01)
*G09G 3/3258* (2016.01)
(Continued)

(52) U.S. Cl.
CPC ....... *H10K 59/1213* (2023.02); *G09G 3/3258* (2013.01); *H10K 59/1216* (2023.02);
(Continued)

(58) Field of Classification Search
CPC ......... G09G 3/3258; G09G 2300/0426; G09G 2300/0852; G09G 3/325;
(Continued)

(56) References Cited

U.S. PATENT DOCUMENTS

| | | | |
|---|---|---|---|
| 2006/0114200 | A1 | 6/2006 | Yamashita et al. |
| 2009/0021509 | A1 | 1/2009 | Lee et al. |

(Continued)

FOREIGN PATENT DOCUMENTS

| | | | |
|---|---|---|---|
| CN | 1783192 | A | 6/2006 |
| CN | 101359141 | A | 2/2009 |

(Continued)

OTHER PUBLICATIONS

Yi; Chu-jun, CN-113053290-A, Machine Translation (Year: 2021).*
International Search Report & Written Opinion mailed Nov. 28, 2022, regarding PCT/CN2022/082308.

*Primary Examiner* — Jacob Y Choi
*Assistant Examiner* — Grace Cha
(74) *Attorney, Agent, or Firm* — Intellectual Valley Law, P.C.

(57) ABSTRACT

A light emitting substrate is provided. The light emitting substrate includes a plurality of subpixels. A respective subpixel of the plurality of subpixels includes n1 number of main light emitting elements; n1 number of main pixel driving circuits configured to drive light emission in the n1 number of main light emitting elements; n2 number of auxiliary light emitting elements; n2 number of auxiliary pixel driving circuits configured to drive light emission in the n2 number of auxiliary light emitting elements; $n1 \geq 1$, and $n2 \geq 1$. A respective main pixel driving circuit of the n1 number of main pixel driving circuits includes a first driving transistor. A respective auxiliary pixel driving circuit of the n2 number of auxiliary pixel driving circuits includes a
(Continued)

second driving transistor. Threshold voltage levels of the first driving transistor and the second driving transistor are substantially the same

14 Claims, 14 Drawing Sheets

(51) Int. Cl.
*H10K 59/131* (2023.01)
*H10K 59/38* (2023.01)

(52) U.S. Cl.
CPC .......... *H10K 59/131* (2023.02); *H10K 59/38* (2023.02); *G09G 2300/0426* (2013.01); *G09G 2300/0852* (2013.01)

(58) Field of Classification Search
CPC .............. G09G 2300/0819; G09G 2300/0861; G09G 2310/0251; H10K 59/1213; H10K 59/1216; H10K 59/131; H10K 59/38
See application file for complete search history.

(56) References Cited

U.S. PATENT DOCUMENTS

| | | | | |
|---|---|---|---|---|
| 2009/0033608 | A1 | 2/2009 | Kim | |
| 2016/0078810 | A1 | 3/2016 | Park et al. | |
| 2017/0256202 | A1 * | 9/2017 | Sun | G09G 3/3233 |
| 2018/0217461 | A1 | 8/2018 | Guo et al. | |
| 2021/0191552 | A1 * | 6/2021 | Bok | G06F 1/1643 |
| 2021/0313410 | A1 | 10/2021 | Kim et al. | |
| 2021/0335248 | A1 * | 10/2021 | Feng | G09G 3/3258 |
| 2021/0359025 | A1 | 11/2021 | Jung et al. | |

FOREIGN PATENT DOCUMENTS

| | | | | |
|---|---|---|---|---|
| CN | 105427810 | A | 3/2016 | |
| CN | 109244116 | A | 1/2019 | |
| CN | 113035910 | A | 6/2021 | |
| CN | 113053290 | A * | 6/2021 | G09G 3/32 |
| CN | 113497109 | A | 10/2021 | |
| CN | 113675246 | A | 11/2021 | |
| CN | 113823210 | A | 12/2021 | |
| TW | 201635515 | A | 10/2016 | |
| WO | 2017219430 | A1 | 12/2017 | |

* cited by examiner

LIGHT EMITTING SUBSTRATE HAVING AUXILIARY PIXEL DRIVING CIRCUIT, DISPLAY PANEL, DISPLAY APPARATUS, AND DISPLAY METHOD

CROSS-REFERENCE TO RELATED APPLICATION

This application is a national stage application under 35 U.S.C. § 371 of International Application No. PCT/CN2022/082308, filed Mar. 22, 2022, the contents of which are incorporated by reference in the entirety.

TECHNICAL FIELD

The present invention relates to display technology, more particularly, to a light emitting substrate, a display panel, a display apparatus, and a display method.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a light emitting substrate, comprising a plurality of subpixels; wherein a respective subpixel of the plurality of subpixels comprises n1 number of main light emitting elements; n1 number of main pixel driving circuits configured to drive light emission in the n1 number of main light emitting elements; n2 number of auxiliary light emitting elements; n2 number of auxiliary pixel driving circuits configured to drive light emission in the n2 number of auxiliary light emitting elements; n1≥1, and n2≥1; wherein a respective main pixel driving circuit of the n1 number of main pixel driving circuits comprises a first storage capacitor, a first driving transistor, a first light emission control transistor, and a compensation subcircuit; wherein a respective auxiliary pixel driving circuit of the n2 number of auxiliary pixel driving circuits comprises a second storage capacitor, a second driving transistor, a second light emission control transistor, and a selection subcircuit; wherein threshold voltage levels of the first driving transistor and the second driving transistor are substantially the same.

Optionally, the compensation subcircuit comprises a first transistor having a gate electrode coupled to a reset control signal line, a source electrode coupled to a drain electrode of the first driving transistor, and a drain electrode coupled to the gate electrode of the first driving transistor and the first capacitor electrode of the first storage capacitor; a second transistor having a gate electrode coupled to a gate line, a source electrode coupled to a data line, and a drain electrode coupled to the second capacitor electrode of the first storage capacitor; a third transistor having a gate electrode coupled to a light emission control signal line, a source electrode coupled to a constant voltage supply line, and a drain electrode coupled to the second capacitor electrode of the first storage capacitor and the drain electrode of the second transistor; and a fourth transistor having a gate electrode coupled to a reset control signal line, a source electrode coupled to the constant voltage supply line, and a drain electrode coupled to an anode of a respective main light emitting element of the n1 number of main light emitting elements.

Optionally, the selection subcircuit comprises a switching transistor having a source electrode coupled to a first driving transistor of the respective main pixel driving circuit and a first capacitor electrode of a first storage capacitor of the respective main pixel driving circuit, and a drain electrode coupled to a gate electrode of the second driving transistor of the respective auxiliary pixel driving circuit; and a control transistor having a gate electrode coupled to a gate line, a source electrode coupled to a control signal line, and a drain electrode coupled to a gate electrode of the switching transistor.

Optionally, a gate electrode of the first driving transistor and a first capacitor electrode of the first storage capacitor are connected to a first node; and a gate electrode of the second driving transistor and a first capacitor electrode of the second storage capacitor are connected to the first node through the switching transistor.

Optionally, the n1 number of main light emitting elements and the n2 number of auxiliary light emitting elements are configured to emit light of a same color.

Optionally, the light of the same color has a wavelength in a range of 435 nm to 480 nm.

Optionally, a respective main light emitting element of the n1 number of main light emitting elements has a first light emitting area; a respective auxiliary light emitting element of the n2 number of auxiliary light emitting elements has a second light emitting area; and the first light emitting area is greater than the second light emitting area.

Optionally, a source electrode of the control transistor of the respective auxiliary pixel driving circuit is coupled to a control signal line; a drain electrode of the control transistor of the respective auxiliary pixel driving circuit is coupled to the gate electrode of the switching transistor of the respective auxiliary pixel driving circuit; a gate electrode of the control transistor of the respective auxiliary pixel driving circuit is coupled to a gate line; and the gate electrode of the control transistor of the respective auxiliary pixel driving circuit is provided with a same gate scanning signal provided to a data write transistor in the respective main pixel driving circuit.

Optionally, the control signal line is configured to provide a control signal; wherein, when the control signal is a turning-on signal, the switching transistor is turned on to allow the gate electrode of the second driving transistor in the respective auxiliary pixel driving circuit and the gate electrode of the first driving transistor in the respective main pixel driving circuit to receive a same voltage signal at the same node; and wherein when the control signal is a turning-off signal, the switching transistor is turned off to disconnect the gate electrode of the second driving transistor in the respective auxiliary pixel driving circuit from the same node.

Optionally, the second storage capacitor of the auxiliary pixel driving circuit comprises a first capacitor electrode and a second capacitor electrode; the first capacitor electrode of the second storage capacitor is coupled to the gate electrode of the switching transistor and to the drain electrode of the control transistor; and the second capacitor electrode of the second storage capacitor is coupled to a constant voltage supply line.

In another aspect, the present disclosure provides a display panel, comprising the light emitting substrate described herein, and a color filter; wherein the color filter comprises a plurality of color filter blocks in a plurality of light transmittance areas, respectively; wherein a respective light transmittance area of the plurality of light transmittance areas at least partially overlaps with light emitting areas of the n1 number of main light emitting elements, and at least partially overlaps with light emitting areas of the n2 number of auxiliary light emitting elements.

Optionally, an orthographic projection of a respective color filter block of the plurality of color filter blocks on a base substrate completely covers an orthographic projection of the n1 number of main light emitting elements on the base substrate, and at least partially overlaps with an orthographic projection of the n2 number of auxiliary light emitting elements on the base substrate.

Optionally, the display panel further comprises a first capping layer on the light emitting substrate; a color conversion layer on a side of the first capping layer away from the light emitting substrate; and a second capping layer on a side of the color conversion layer away from the first capping layer; wherein the color filter is on a side of the second capping layer away from the color conversion layer; and the color conversion layer comprises a plurality of color conversion blocks of a first color, a plurality of color conversion blocks of a second color, and a plurality of light transmissive block.

Optionally, a center of an orthographic projection of the n1 number of main light emitting elements on a base substrate substantially overlaps with a center of an orthographic projection of a respective color filter block of the plurality of color filter blocks on the base substrate.

In another aspect, the present disclosure provides a display apparatus, comprising the light emitting substrate described herein, and one or more integrated circuits connected to the light emitting substrate.

In another aspect, the present disclosure provides a display method, comprising providing a display panel comprising a plurality of subpixels, a respective subpixel of the plurality of subpixels comprising n1 number of main light emitting elements and n2 number of auxiliary light emitting elements, $n1 \geq 1$, and $n2 \geq 1$; for displaying a first frame of image, controlling light emission of the respective subpixel to be limited in the n1 number of main light emitting elements and m number of the n2 number of auxiliary light emitting elements, $0 \leq m \leq n2$; and for displaying a second frame of image, controlling light emission of the respective subpixel to be limited in the n1 number of main light emitting elements and m' number of the n2 number of auxiliary light emitting elements, $0 \leq m' \leq n2$, and $m \neq m'$.

Optionally, for displaying the first frame of image in a first mode, the light emission of the respective subpixel is limited in the n1 number of main light emitting elements, m=0; and wherein, for displaying the second frame of image in a second mode, the light emission of the respective subpixel is limited in the n1 number of main light emitting elements and the n2 number of auxiliary light emitting elements, m'=n2.

Optionally, in the first mode, at least a portion of the display panel comprising the respective subpixel is configured to display a monochromatic image, or the first frame of image has a high contrast compared to a frame of image in an adjacent subpixel; and in the second mode, at least a portion of the display panel comprising the respective subpixel is configured to display a color image.

Optionally, the display method further comprises, for displaying a third frame of image in a third mode, controlling light emission of the respective subpixel to be limited in the n1 number of main light emitting elements and m" number of the n2 number of auxiliary light emitting elements, $1 < m'' < n2$, and $m < m'' < m'$.

Optionally, the display method comprises driving light emission in a respective main light emitting element of the n1 number of main light emitting elements by a respective main pixel driving circuit; and driving light emission in a respective auxiliary light emitting element of the n2 number of auxiliary light emitting elements by a respective auxiliary pixel driving circuit coupled to the respective main pixel driving circuit.

Optionally, driving light emission in the respective auxiliary light emitting element and in the respective main light emitting element comprises providing a same voltage signal to a gate electrode of a second driving transistor in the respective auxiliary pixel driving circuit and to a gate electrode of a first driving transistor in the respective main pixel driving circuit.

Optionally, the display method further comprises providing a control signal to the respective auxiliary pixel driving circuit to control transmission of the same voltage signal to the gate electrode of the second driving transistor in the respective auxiliary pixel driving circuit; wherein, when the control signal is a turning-on signal, the same voltage signal is transmitted to the gate electrode of the second driving transistor in the respective auxiliary pixel driving circuit, thereby turning on the second driving transistor; and wherein when the control signal is a turning-off signal, the gate electrode of the second driving transistor in the respective auxiliary pixel driving circuit is configured not to receive the same voltage signal, and the second driving transistor is turned off.

Optionally, the display method comprises providing a data signal to the respective main pixel driving circuit configured to drive light emission in the respective main light emitting element, without providing the data signal to the respective auxiliary pixel driving circuit configured to drive light emission in the respective auxiliary light emitting element.

Optionally, the display method comprises providing a same light emission control signal to a first light emission control transistor in the respective main pixel driving circuit and a second light emission control transistor in the respective auxiliary pixel driving circuit.

Optionally, the display method comprises providing a same gate scanning signal to a data write transistor in the respective main pixel driving circuit and to a control transistor in the respective auxiliary pixel driving circuit.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a light emitting substrate, a display panel, a display apparatus, and a display method that substantially obviate one or more of the problems due to limitations and disadvantages of the related art. In one aspect, the present disclosure provides a display method. In some embodiments, the display method includes providing a display panel comprising a plurality of subpixels, a respective subpixel of the plurality of subpixels comprising n1 number of main light emitting elements and n2 number of auxiliary light emitting elements, $n1 \geq 1$, and $n2 \geq 1$; for displaying a first frame of image, controlling light emission of the respective subpixel to be limited in the n1 number of main light emitting elements and m number of the n2 number of auxiliary light emitting elements, $0 \leq m \leq n2$; and for displaying a second frame of image, controlling light emission of the respective subpixel to be limited in the n1 number of main light emitting elements and m' number of the n2 number of auxiliary light emitting elements, $0 \leq m' \leq n2$, and $m \neq m'$.

Figure 1:
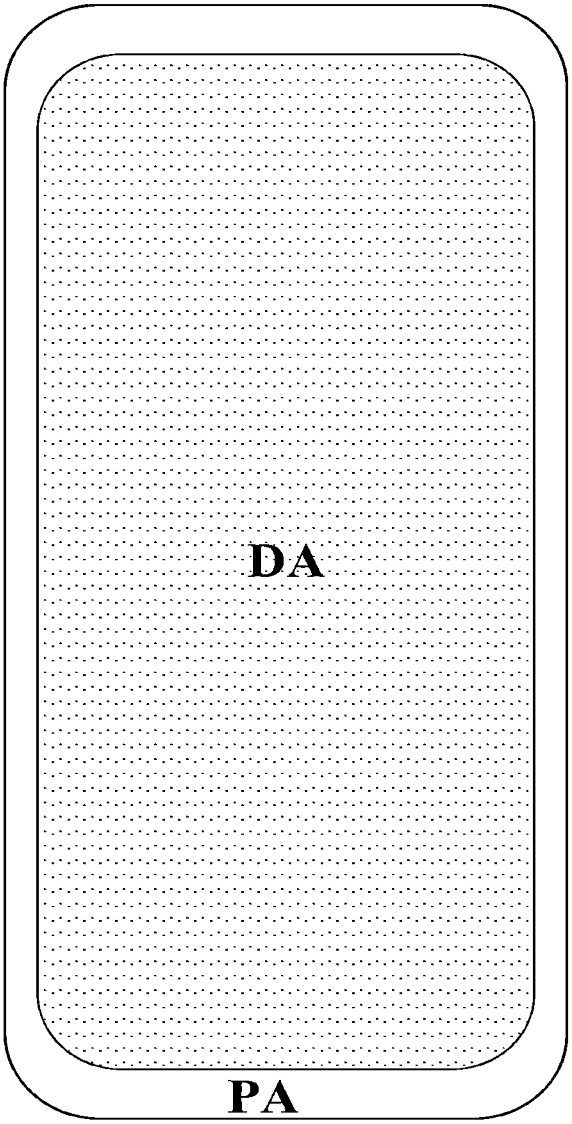
FIG. 1 is a schematic diagram illustrating the structure of a light emitting substrate in some embodiments according to the present disclosure.

FIG. 1 is a schematic diagram illustrating the structure of a light emitting substrate in some embodiments according to the present disclosure. Referring to FIG. 1, the light emitting substrate in some embodiments includes a display region DA and a peripheral region PA. As used herein, the term "display region" refers to an area of a light emitting substrate in a display panel where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. As used herein the term "peripheral region" refers to an area of a light emitting substrate in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral region rather than in the display region.

Figure 2:
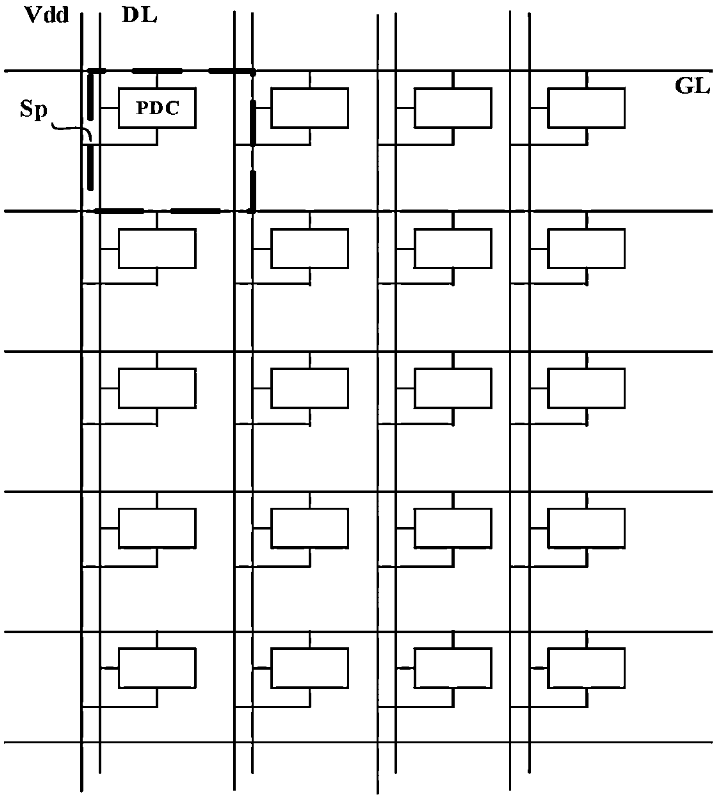
FIG. 2 is a circuit diagram of a light emitting substrate in some embodiments according to the present disclosure.

FIG. 2 is a circuit diagram of a light emitting substrate in some embodiments according to the present disclosure. Referring to FIG. 2, the light emitting substrate includes an array of subpixels. Each subpixel includes an electronic component, e.g., a light emitting element. In some embodiments, the light emitting substrate further includes a plurality of light emitting elements driven by the plurality of pixel driving circuits. In one example, the light emitting element is driven by a respective pixel driving circuit. The light emitting substrate includes a plurality of gate lines GL, a plurality of data lines DL, and a plurality of power supply voltage lines Vdd. Light emission in a respective subpixel Sp is driven by a respective pixel driving circuit PDC. In one example, a high voltage signal is input, through a respective one of the plurality of power supply voltage lines Vdd, to the respective pixel driving circuit PDC connected to an anode of the light emitting element; a low voltage signal (a constant voltage supply line) is input to a cathode of the light emitting element. A voltage difference between the high voltage signal (e.g., the VDD signal) and the low voltage signal (e.g., the VSS signal) is a driving voltage $\Delta V$ that drives light emission in the light emitting element.

The light emitting substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the light emitting substrate includes the respective first subpixel, the respective second subpixel, the respective third subpixel, and the respective fourth subpixel. The plurality of subpixels in the light emitting substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

Various appropriate pixel driving circuits may be used in the present light emitting substrate. Examples of appropriate driving circuits include 3T1C, 2T1C, 4T1C, 4T2C, 5T2C, 6T1C, 7T1C, 7T2C, 8T1C, and 8T2C. Various appropriate light emitting elements may be used in the present light emitting substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 3:
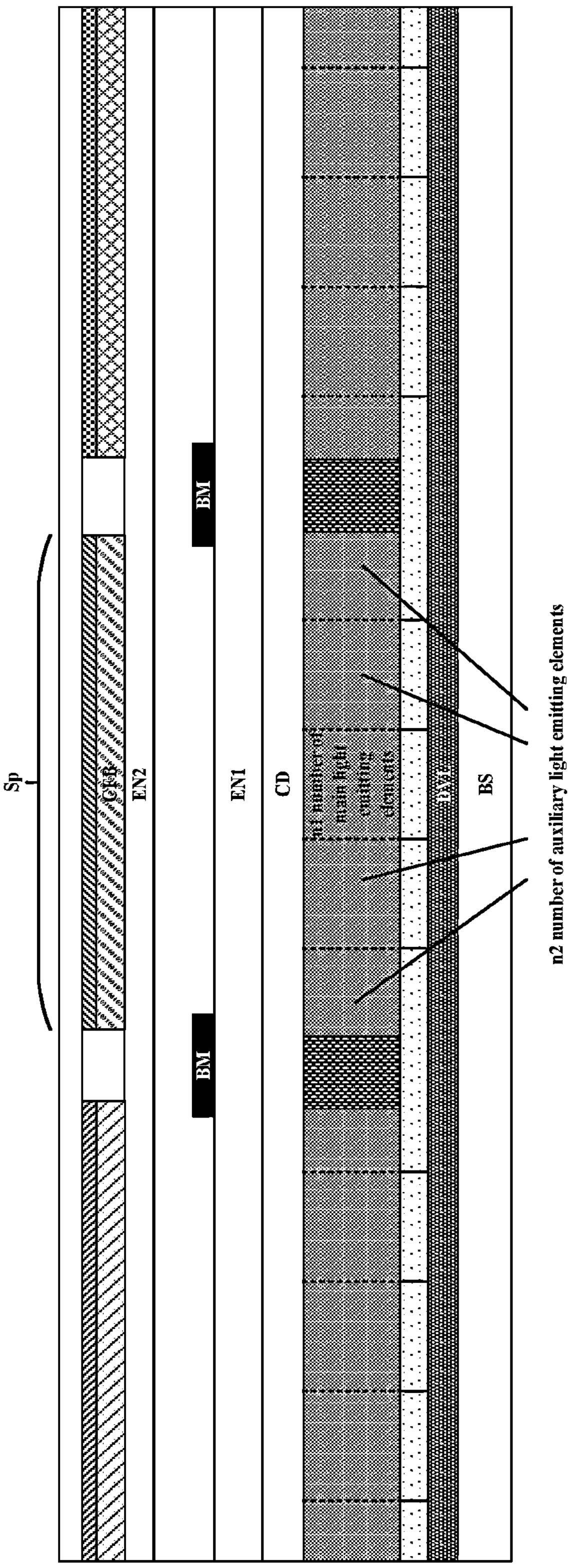
FIG. 3 is a cross-sectional view of a light emitting substrate in some embodiments according to the present disclosure.

FIG. 3 is a cross-sectional view of a light emitting substrate in some embodiments according to the present disclosure. Referring to FIG. 3, the display panel in some embodiments includes a plurality of subpixels. A respective subpixel Sp of the plurality of subpixels in some embodiments includes n1 number of main light emitting elements and n2 number of auxiliary light emitting elements, n1≥1, and n2≥1. Optionally, n1 is an integer. Optionally, n2 is an integer.

In the present light emitting substrate, the term "subpixel" refers to an element of a pixel, the subpixel may include multiple pixel driving circuits and multiple light emitting elements. However, the multiple light emitting elements in a subpixel emit light to achieve a grayscale required for the element of the pixel. For example, a pixel may include three subpixels, a red subpixel, a green subpixel, and a blue subpixel. To display a pixel of an image, the red subpixel emits light to achieve a first grayscale, the green subpixel emits light to achieve a second grayscale, and the blue subpixel emits light to achieve a third grayscale. Light emitted from the multiple light emitting elements in a red subpixel together achieves the first grayscale. Light emitted from the multiple light emitting elements in a green subpixel together achieves the second grayscale. Light emitted from the multiple light emitting elements in a blue subpixel together achieves the third grayscale. Accordingly, the multiple pixel driving circuits are controlled by at least one same control signal. For example, a signal from a light emitting control signal line may be transmitted to the multiple pixel driving circuits in phase as the light emitting control signal for each of the multiple pixel driving circuits. In another example, a signal from a gate line may be transmitted to the multiple pixel driving circuits in phase as the gate scanning signal for each of the multiple pixel driving circuits. In another example, only one data signal is transmitted to the multiple pixel driving circuits, e.g., the data signal is transmitted to only one or two of the multiple pixel driving circuits.

Referring to FIG. 3 again, the light emitting substrate further includes a pixel driving layer DVL, which includes n1 number of main pixel driving circuits and n2 number of auxiliary pixel driving circuits, n1≥1, and n2≥1. Optionally, n1 is an integer. Optionally, n2 is an integer. A respective main pixel driving circuit of the n1 number of main pixel driving circuits is configured to drive light emission in a respective main light emitting element of the n1 number of main light emitting elements. A respective auxiliary pixel driving circuit of the n2 number of auxiliary pixel driving circuits is configured to drive light emission in a respective auxiliary light emitting element of the n2 number of auxiliary light emitting elements.

Figure 4:
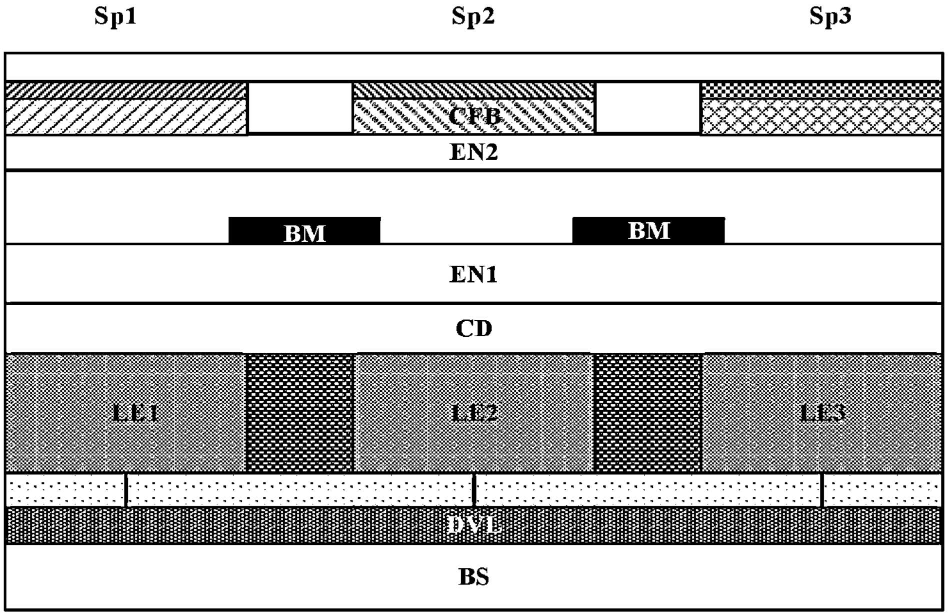
FIG. 4 is a cross-sectional view of a light emitting substrate in some embodiments according to the present disclosure.

FIG. 4 is a cross-sectional view of a light emitting substrate in some embodiments according to the present disclosure. Referring to FIG. 4, a pixel of the light emitting substrate includes three subpixels, Sp1, Sp2, and Sp3. Each subpixel includes a single light emitting element and a single pixel driving circuit in a pixel driving layer DVL. Three light emitting elements, LE1, LE2, and LE3 are denoted in FIG. 4. The inventors of the present disclosure discover that cross-talk issue occurs between adjacent subpixels. For example, light emitted from the first light emitting element LE1 may enter the second subpixel Sp2. To reduce the cross-talk, the light emitting substrate includes a black matrix BM in an inter-subpixel region between adjacent subpixels. However, the inventors of the present disclosure discover that the black matrix BM typically absorbs light, lowering light utilization efficiency in the light emitting substrate. The cross-talk issue is particularly prominent when all of the light emitting elements are blue light emitting elements, due to the wide angle of light emitted from the blue light emitting elements.

The inventors of the present disclosure discover that the display method and the intricate structure of the light emitting substrate according to the present disclosure can efficiently prevent inter-subpixel cross-talk while maintaining an excellent light utilization efficiency. The present display method includes multiple display modes in which different number of light emitting elements in a same subpixel are configured to emit light. In some embodiments, for displaying a first frame of image, the method includes controlling light emission of a respective subpixel to be limited in the n1 number of main light emitting elements and m number of the n2 number of auxiliary light emitting elements, 0≤m≤n2. For displaying a second frame of image, controlling light emission of the respective subpixel to be limited in the n1 number of main light emitting elements and m' number of the n2 number of auxiliary light emitting elements, 0≤m'≤n2, and m≠m'.

In one example, for displaying the first frame of image in a first mode, the light emission of the respective subpixel is limited in the n1 number of main light emitting elements, m=0. For displaying the second frame of image in a second mode, the light emission of the respective subpixel is limited in the n1 number of main light emitting elements and the n2 number of auxiliary light emitting elements, m'=n2.

Figure 5A:
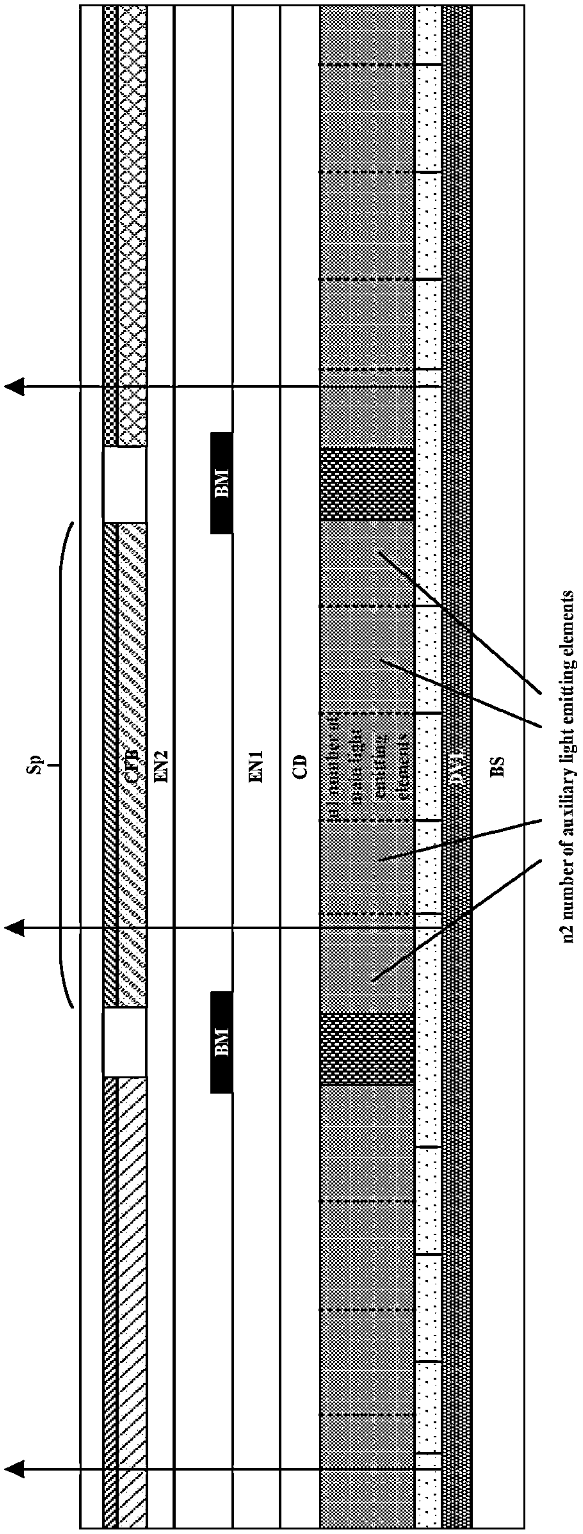
FIG. 5A illustrates image display in a first mode in a light emitting substrate in some embodiments according to the present disclosure.
Figure 5B:
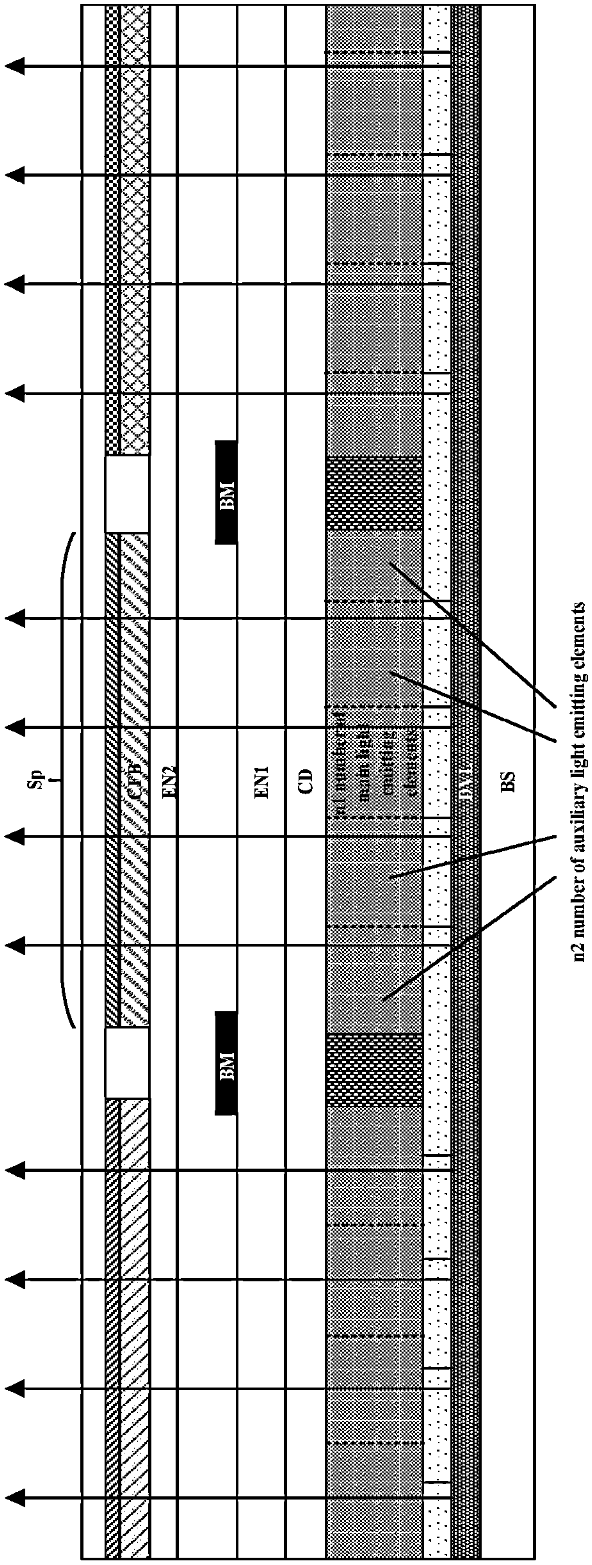
FIG. 5B illustrates image display in a second mode in a light emitting substrate in some embodiments according to the present disclosure.

FIG. 5A illustrates image display in a first mode in a light emitting substrate in some embodiments according to the present disclosure. In the example depicted in FIG. 5A, n1=1, n2=3. Referring to FIG. 5A, in the first mode, only the n1 number of main light emitting elements are configured to emit light, whereas the n2 number of auxiliary light emitting elements are not configured to emit light. FIG. 5B illustrates image display in a second mode in a light emitting substrate in some embodiments according to the present disclosure. Referring to FIG. 5B, in the second mode, the n1 number of main light emitting elements and the n2 number of auxiliary light emitting elements are all configured to emit light.

Different display modes according to the present display method may be used in different scenarios. In one example, a first mode is used when at least a portion of the display panel comprising the respective subpixel is configured to display a monochromatic image. Referring to FIGS. 5A and 5B, the n1 number of main light emitting elements are adjacent to the black matrix BM, which prevents cross-talk between the respective subpixel and a first adjacent subpixel on a first side (the left side) of the respective subpixel. Because the n2 number of auxiliary light emitting elements do not emit light, and the n1 number of main light emitting elements are spaced apart from a second adjacent subpixel on a second side (the right side), cross-talk between the respective subpixel and the second adjacent subpixel on the second side of the respective subpixel is also prevented.

Similarly, the first mode may be used when the first frame of image of the respective subpixel has a high contrast compared to a frame of image in an adjacent subpixel. In one example, the first mode is used when the frame of image in the adjacent subpixel has a lower grayscale than the first frame of image of the respective subpixel.

In another example, a second mode is used when at least a portion of the display panel comprising the respective subpixel is configured to display a color image, for which light utilization efficiency becomes more important. For example, to achieve a brightness of 80 nit in the respective subpixel, the n1 number of main light emitting elements may be configured to contribute 65 nit while the n2 number of auxiliary light emitting elements contributes 15 nit, light utilization efficiency may be significantly enhanced in the light emitting substrate.

The display modes are not limited to the first mode and the second mode. A total of n2 number of modes may be implemented in the present display method. In some embodiments, a third mode is use. For displaying a third frame of image in a third mode, the method includes controlling light emission of the respective subpixel to be limited in the n1 number of main light emitting elements and m" number of the n2 number of auxiliary light emitting elements, 1<m"<n2, and m<m"<m'.

Figure 6:
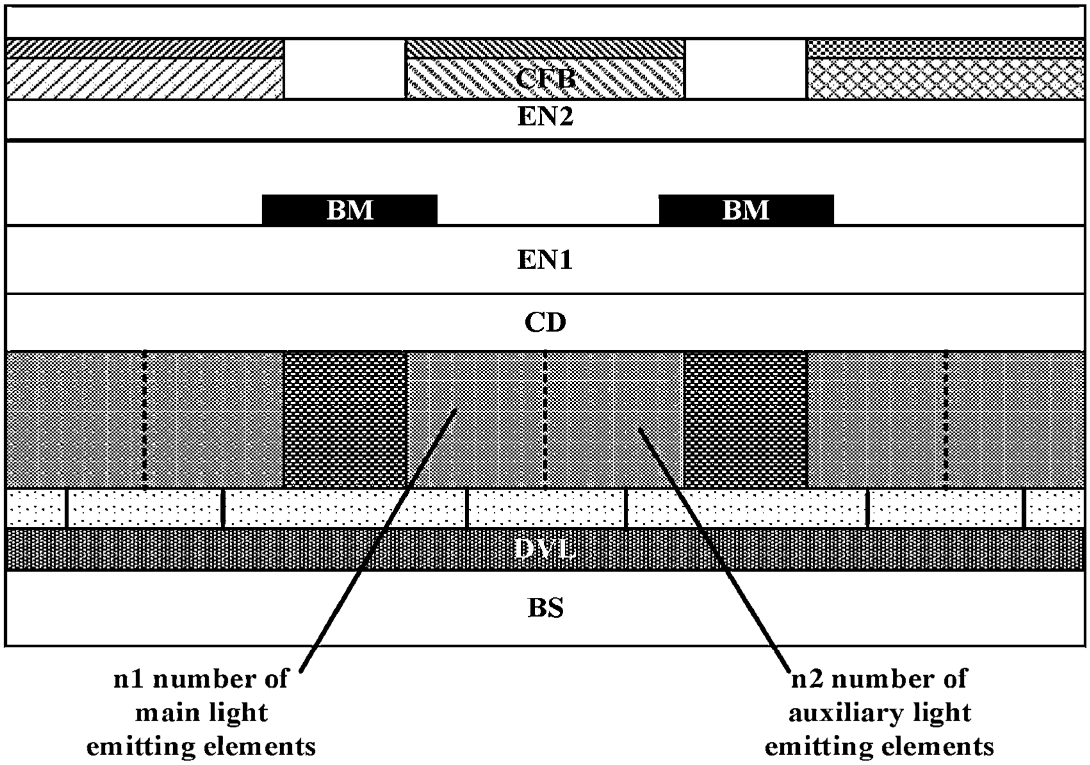
FIG. 6 is a cross-sectional view of a light emitting substrate in some embodiments according to the present disclosure.

In one example, n1=1, and n2=1. FIG. 6 is a cross-sectional view of a light emitting substrate in some embodiments according to the present disclosure. Referring to FIG. 6, in some embodiments, the n1 number of main light emitting elements consists of a single main light emitting element, the n2 number of auxiliary light emitting elements consists of a single auxiliary light emitting element, the n1 number of main pixel driving circuits in a pixel driving layer DVL consists of a single main pixel driving circuit, the n2 number of auxiliary pixel driving circuits consists of a single auxiliary pixel driving circuit.

Various appropriate implementations may be used for achieving the display method. In some embodiments, each of the n2 number of modes may be realized by controlling the n1 number of main pixel driving circuits and the n2 number of auxiliary pixel driving circuits. In some embodiments, the method includes driving light emission in a respective main light emitting element of the n1 number of main light emitting elements by a respective main pixel driving circuit; and driving light emission in a respective auxiliary light emitting element of the n2 number of auxiliary light emitting elements by a respective auxiliary pixel driving circuit coupled to the respective main pixel driving circuit.

Figure 7:
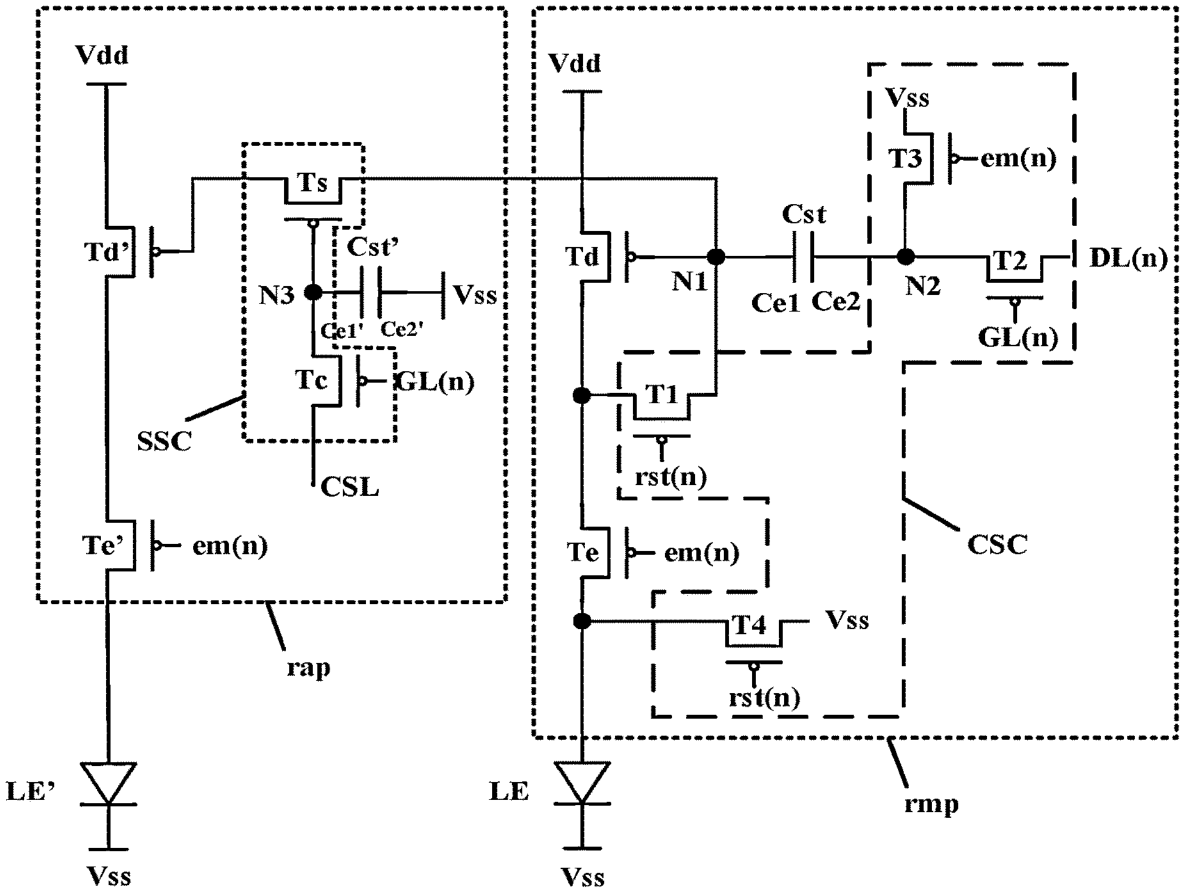
FIG. 7 is a circuit diagram illustrating the structure of a respective main pixel driving circuit, a respective auxiliary pixel driving circuit, a respective main light emitting element, and a respective auxiliary light emitting element in some embodiments according to the present disclosure.

FIG. 7 is a circuit diagram illustrating the structure of a respective main pixel driving circuit, a respective auxiliary pixel driving circuit, a respective main light emitting element, and a respective auxiliary light emitting element in some embodiments according to the present disclosure. Various appropriate pixel driving circuits may be used in the present light emitting substrate. Examples of appropriate driving circuits for the respective main pixel driving circuit and the respective auxiliary pixel driving circuit include 3T1C, 2T1C, 4T1C, 4T2C, 5T2C, 6T1C, 7T1C, 7T2C, 8T1C, and 8T2C. In one example, the respective auxiliary pixel driving circuit has a simpler circuit structure as compared to the respective main pixel driving circuit. In another example, the respective main pixel driving circuit has a total number of transistors greater than the respective auxiliary pixel driving circuit.

Referring to FIG. 7, in one example, the respective main pixel driving circuit rmp is a 6T1C driving circuit. In some embodiments, the respective main pixel driving circuit rmp includes a first storage capacitor Cst comprising a first capacitor electrode Ce1 and a second capacitor electrode Ce2; a first driving transistor Td having a gate electrode coupled to the first capacitor electrode Ce1, a source electrode coupled to a power supply voltage signal line Vdd; a first transistor T1 having a gate electrode coupled to a reset control signal line rst(n), a source electrode coupled to a drain electrode of the first driving transistor Td, and a drain electrode coupled to the gate electrode of the first driving transistor Td and the first capacitor electrode Ce1; a second transistor T2 having a gate electrode coupled to a gate line GL(n), a source electrode coupled to a data line DL(n), and a drain electrode coupled to the second capacitor electrode Ce2; a third transistor T3 having a gate electrode coupled to a light emission control signal line em(n), a source electrode coupled to a constant voltage supply line Vss, and a drain electrode coupled to the second capacitor electrode Ce2 and the drain electrode of the second transistor T2; a fourth transistor T4 having a gate electrode coupled to a reset control signal line rst(n), a source electrode coupled to the constant voltage supply line Vss, and a drain electrode coupled to an anode of a respective main light emitting element LE of the n1 number of main light emitting elements; and a first light emission control transistor Te having a gate electrode coupled to the light emission control signal line em(n), a source electrode coupled to the drain electrode of the first driving transistor Td and the source electrode of the first transistor T1, and a drain electrode coupled to the anode of the respective main light emitting element LE and the drain electrode of the fourth transistor T4.

Referring to FIG. 7, in one example, the respective auxiliary pixel driving circuit rap is a 4T1C driving circuit. In some embodiments, the respective auxiliary pixel driving circuit rap includes a second driving transistor Td' having a source electrode coupled to a power supply voltage signal line Vdd; a second light emission control transistor Te' having a gate electrode coupled to a light emission control signal line em(n), a source electrode coupled to a drain electrode of the second driving transistor Td', and a drain electrode coupled to the anode of a respective auxiliary light emitting element LE' of the n2 number of auxiliary light emitting elements; a switching transistor Ts having a source electrode coupled to a first driving transistor Td of the respective main pixel driving circuit rmp and a first capacitor electrode Ce1 of a first storage capacitor Cst of the respective main pixel driving circuit rmp, and a drain electrode coupled to a gate electrode of the second driving transistor Td' of the respective auxiliary pixel driving circuit rap; a control transistor Tc having a gate electrode coupled to a gate line GL(n), a source electrode coupled to a control signal line CSL, and a drain electrode coupled to a gate electrode of the switching transistor Ts; a second storage capacitor Cst' having a first capacitor electrode Ce1' coupled to the gate electrode of the switching transistor Ts and the drain electrode of the control transistor Tc, and a second capacitor electrode Ce2' coupled to a constant voltage supply line Vss.

Figure 8:
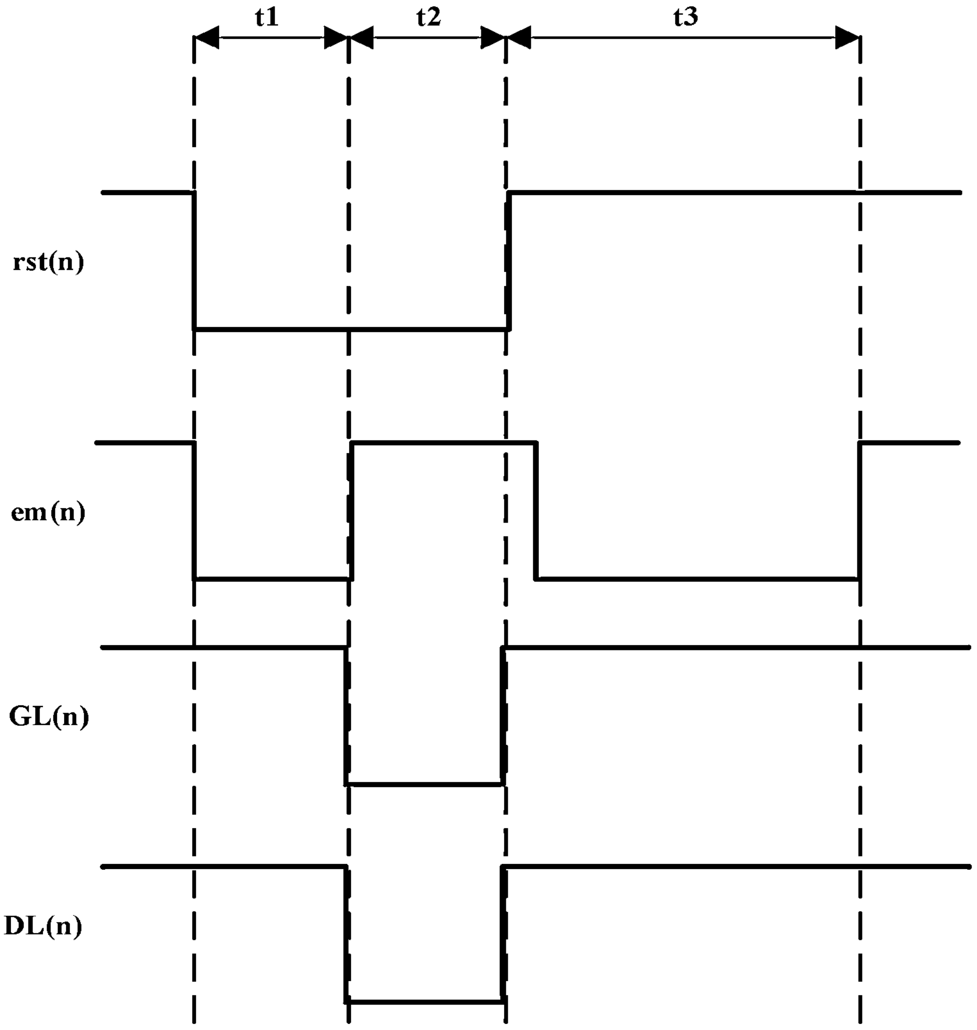
FIG. 8 is a timing diagram of operating a light emitting substrate in some embodiments according to the present disclosure.

FIG. 8 is a timing diagram of operating a light emitting substrate in some embodiments according to the present disclosure. Referring to FIG. 8, an image display phase with respect to the respective subpixel in some embodiments includes a first sub-phase t1 and a second sub-phase t2. In the first sub-phase t1, the reset control signal line rst(n) is configured to provide a low voltage signal to the gate electrodes of the first transistor T1 and the fourth transistor T4 in the respective main pixel driving circuit, thereby turning on the first transistor T1 and the fourth transistor T4. The light emission control signal line em(n) is configured to provide a low voltage signal to the gate electrodes of the third transistor T3 and the first light emission control transistor Te in the respective main pixel driving circuit, thereby turning on the third transistor T3 and the first light emission control transistor Te. The light emission control signal line em(n) is configured to provide the same low voltage signal to the gate electrode of the second light emission control transistor Te' in the respective auxiliary pixel driving circuit, thereby turning on the second light emission control transistor Te' in the respective auxiliary pixel driving circuit rap. In the first sub-phase t1, the switching transistor Ts in the respective auxiliary pixel driving circuit rap is turned off. The voltage level at the N1 node and at the N2 node are reset to a low voltage level of the constant voltage supply line Vss.

In the second sub-phase t2, the reset control signal line rst(n) is configured to provide a low voltage signal to the gate electrodes of the first transistor T1 and the fourth transistor T4 in the respective main pixel driving circuit, thereby turning on the first transistor T1 and the fourth transistor T4. The light emission control signal line em(n) is configured to provide a high voltage signal to the gate electrodes of the third transistor T3 and the first light emission control transistor Te in the respective main pixel driving circuit rmp, thereby turning off the third transistor T3 and the first light emission control transistor Te. The light emission control signal line em(n) is configured to provide the same high voltage signal to the gate electrode of the second light emission control transistor Te' in the respective auxiliary pixel driving circuit, thereby turning off the second light emission control transistor Te' in the respective auxiliary pixel driving circuit rap. The gate line GL(n) is configured to provide a low voltage signal to the gate electrode of the second transistor T2 in the respective main pixel driving circuit rmp, thereby turning on the second transistor T2 in the respective main pixel driving circuit rmp. The gate line GL(n) is configured to provide a same low voltage signal to the gate electrode of the control transistor Tc in the respective auxiliary pixel driving circuit rap, thereby turning on the control transistor Tc in the respective auxiliary pixel driving circuit rap. In the second sub-phase t2, the third transistor T3 in the respective main pixel driving circuit rmp is turned off. The first transistor T1 and the second transistor T2 in the respective main pixel driving circuit rmp are turned on. The first light emission control transistor Te in the respective main pixel driving circuit rmp is turned off. The N1 node charges the gate electrode of the first driving transistor Td until the voltage level at the gate electrode of the first driving transistor Td reaches a level of the power supply voltage signal line Vdd plus a threshold voltage of the first driving transistor Td. The N2 node is charged to a level of the data line DL(n). The control transistor Tc in the respective auxiliary pixel driving circuit rap is turned on, the N3 node is charged to a level of the control signal line CSL. The control signal line CSL is configured to provide either a high voltage signal (VGH) or a low voltage signal (VGL).

In the third sub-phase t3, the light emission control signal line em(n) is configured to provide a low voltage signal to the gate electrodes of the third transistor T3 and the first light emission control transistor Te in the respective main pixel driving circuit rmp, thereby turning on the third transistor T3 and the first light emission control transistor Te. The light emission control signal line em(n) is configured to provide the same low voltage signal to the gate electrode of the second light emission control transistor Te' in the respective auxiliary pixel driving circuit, thereby turning on the second light emission control transistor Te' in the respective auxiliary pixel driving circuit rap. The gate line GL(n) is configured to provide a high voltage signal to the gate electrode of the second transistor T2 in the respective main pixel driving circuit rmp, thereby turning off the second transistor T2 in the respective main pixel driving circuit rmp. The gate line GL(n) is configured to provide a same high voltage signal to the gate electrode of the control transistor Tc in the respective auxiliary pixel driving circuit rap, thereby turning off the control transistor Tc in the respective auxiliary pixel driving circuit rap. The reset control signal line rst(n) is configured to provide a high voltage signal to the gate electrodes of the first transistor T1 and the fourth transistor T4 in the respective main pixel driving circuit, thereby turning off the first transistor T1 and the fourth transistor T4. The voltage level at the N2 node changes from the level of the data line DL(n) to the level of the constant voltage supply line Vss. The voltage level at the N1 node changes from Vdd+Vth (the level of the power supply voltage signal line Vdd plus the threshold voltage of the first driving transistor Td) to Vdd+Vth+Vss−DL(n) (a level of the power supply voltage signal line Vdd plus the threshold voltage of the first driving transistor Td, plus the level of the constant voltage supply line Vss, minus the level of the data line DL(n)).

If, in the second sub-phase t2, the control signal line CSL is configured to provide the high voltage signal (VGH), the switching transistor Ts is turned off in the third sub-phase t3, and the respective auxiliary light emitting element LE' does not emit light in the third sub-phase t3.

If, in the second sub-phase t2, the control signal line CSL is configured to provide the low voltage signal (VGL), the switching transistor Ts is turned on in the third sub-phase t3. The gate electrode of the second driving transistor Td' in the respective auxiliary pixel driving circuit rap is charged to a same voltage level at the N1 node, e.g., to Vdd+Vth+Vss−DL(n) (the level of the power supply voltage signal line Vdd plus the threshold voltage of the first driving transistor Td, plus the level of the constant voltage supply line Vss, minus the level of the data line DL(n)). Because the second light emission control transistor Te' in the respective auxiliary pixel driving circuit rap is turned on in the third sub-phase t3, the respective auxiliary light emitting element LE' emits light in the third sub-phase t3.

In some embodiments, the respective main pixel driving circuit rmp includes a compensation subcircuit CSC. Optionally, the compensation subcircuit CSC includes a first transistor T1 having a gate electrode coupled to a reset control signal line rst(n), a source electrode coupled to a drain electrode of the first driving transistor Td, and a drain electrode coupled to the gate electrode of the first driving transistor Td and the first capacitor electrode Ce1 of the storage capacitor Cst; a second transistor T2 having a gate electrode coupled to a gate line GL(n), a source electrode coupled to a data line DL(n), and a drain electrode coupled to the second capacitor electrode Ce2 of the storage capacitor Cst; a third transistor T3 having a gate electrode coupled to a light emission control signal line em(n), a source electrode coupled to a constant voltage supply line Vss, and a drain electrode coupled to the second capacitor electrode Ce2 of the storage capacitor Cst and the drain electrode of the second transistor T2; and a fourth transistor T4 having a gate electrode coupled to a reset control signal line rst(n), a source electrode coupled to the constant voltage supply line Vss, and a drain electrode coupled to an anode of a respective main light emitting element LE of the n1 number of main light emitting elements.

In some embodiments, the respective auxiliary pixel driving circuit rap shares the compensation subcircuit CSC with the respective main pixel driving circuit rmp. In some embodiments, threshold voltage levels of the first driving transistor Td and the second driving transistor Td' are substantially the same. Optionally, a ratio of a channel width to a channel length of the active layer in the first driving transistor Td and a ratio of a channel width to a channel length of the active layer in the second driving transistor Td' are substantially the same.

In one example, the first driving transistor Td and the second driving transistor Td' are fabricated in the light emitting substrate so that they are proximal to each other, to ensure their threshold voltage levels are substantially the same. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

In some embodiments, the respective auxiliary pixel driving circuit rap includes a selection subcircuit SSC. Optionally, the selection subcircuit SSC includes a switching transistor Ts having a source electrode coupled to a first driving transistor Td of the respective main pixel driving circuit rmp and a first capacitor electrode Ce1 of a first storage capacitor Cst of the respective main pixel driving circuit rmp, and a drain electrode coupled to a gate electrode of the second driving transistor Td' of the respective auxiliary pixel driving circuit rap; and a control transistor Tc having a gate electrode coupled to a gate line GL(n), a source electrode coupled to a control signal line CSL, and a drain electrode coupled to a gate electrode of the switching transistor Ts.

Referring to FIG. 7, gate electrodes of the second driving transistor Td' in the respective auxiliary pixel driving circuit rap and the first driving transistor Td in the respective main pixel driving circuit rmp are commonly coupled to the N1 node. As discussed above, when the control signal line CSL is configured to provide a turning-on voltage in the second sub-phase t2, the gate electrode of the second driving transistor Td' in the respective auxiliary pixel driving circuit rap is charged to a same voltage level at the N1 node, and the respective auxiliary light emitting element LE' emits light in the third sub-phase t3. Accordingly, the display method in some embodiments includes providing a same voltage signal to a gate electrode of a second driving transistor Td' in the respective auxiliary pixel driving circuit and to a gate electrode of a first driving transistor Td in the respective main pixel driving circuit, thereby driving light emission in the respective auxiliary light emitting element and in the respective main light emitting element.

In some embodiments, the display method includes providing a control signal to the respective auxiliary pixel driving circuit to control transmission of the same voltage signal to the gate electrode of the second driving transistor Td' in the respective auxiliary pixel driving circuit. Optionally, when the control signal is a turning-on signal, the same voltage signal is transmitted to the gate electrode of the second driving transistor in the respective auxiliary pixel driving circuit, thereby turning on the second driving transistor. The respective auxiliary light emitting element LE' emits light. Optionally, the control signal is a turning-off signal, the gate electrode of the second driving transistor in the respective auxiliary pixel driving circuit is configured not to receive the same voltage signal, and the second driving transistor is turned off. The respective auxiliary light emitting element LE' does not emit light.

Referring to FIG. 7, the data signal for the respective subpixel is provided only to the respective main pixel driving circuit rmp, but not to the respective auxiliary pixel driving circuit rap. Specifically, the data signal for the respective subpixel is provided to the source electrode of the second transistor T2 in the respective main pixel driving circuit rmp. In some embodiments, the display method includes providing a data signal to the respective main pixel driving circuit rmp configured to drive light emission in the respective main light emitting element LE, without providing the data signal to the respective auxiliary pixel driving circuit rap configured to drive light emission in the respective auxiliary light emitting element LE'.

In some embodiments, the display method includes providing a same light emission control signal to a light emission control transistor in the respective main pixel driving circuit and the respective auxiliary pixel driving circuit. As shown in FIG. 7, the same light emission control signal is provided, in phase, to the first light emission control transistor Te in the respective main pixel driving circuit rmp, and to the second light emission control transistor Te' in the respective auxiliary pixel driving circuit rap.

In some embodiments, the display method includes providing a same gate scanning signal, in phase, to a data write transistor (e.g., the second transistor T2) in the respective main pixel driving circuit rmp and to a control transistor Tc in the respective auxiliary pixel driving circuit rap.

Figure 9:
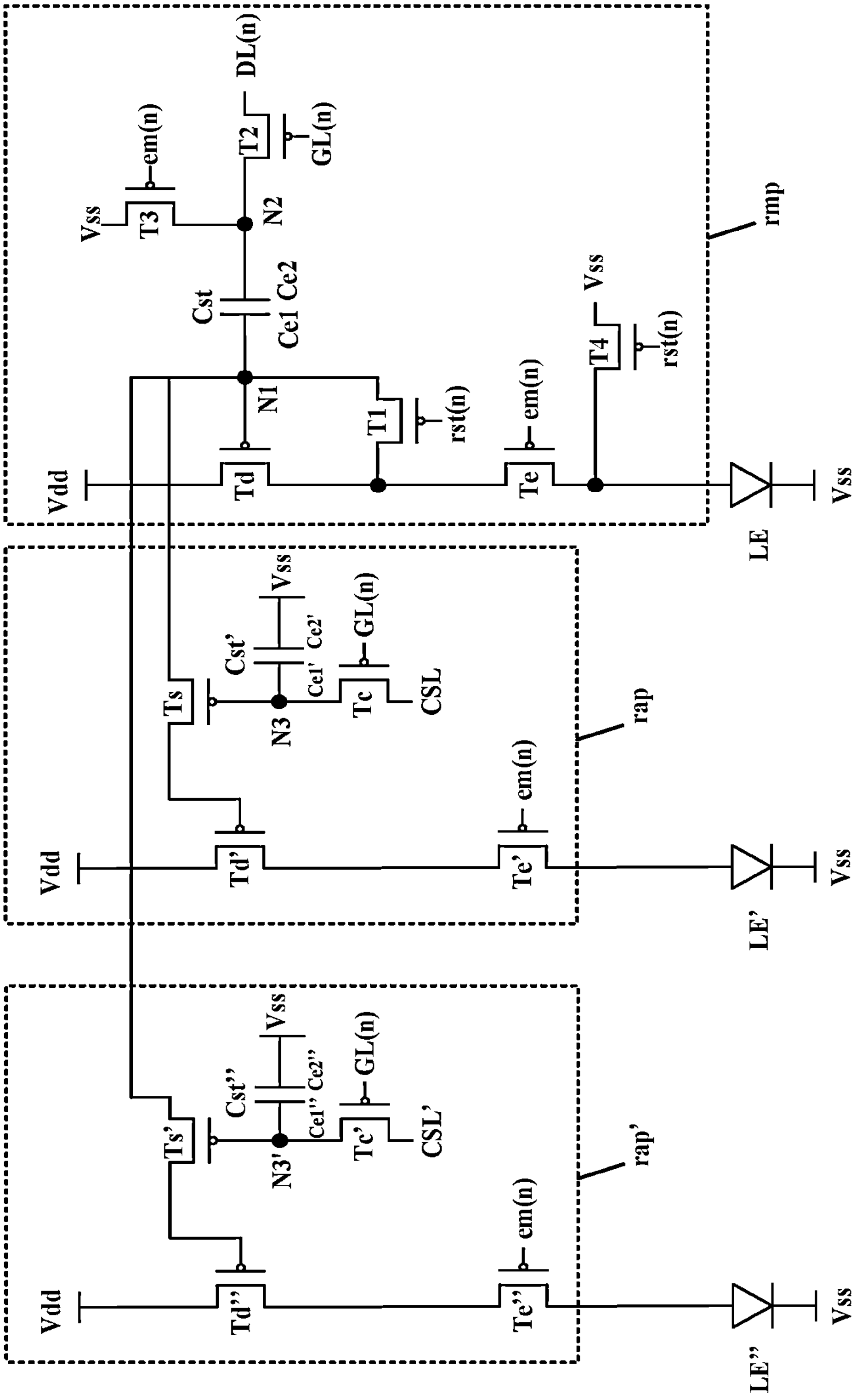
FIG. 9 is a circuit diagram illustrating the structure of a respective main pixel driving circuit, a respective auxiliary pixel driving circuit, a second respective auxiliary pixel driving circuit, a respective main light emitting element, a respective auxiliary light emitting element and a second respective auxiliary light emitting element in some embodiments according to the present disclosure.

FIG. 9 is a circuit diagram illustrating the structure of a respective main pixel driving circuit, a respective auxiliary pixel driving circuit, a second respective auxiliary pixel driving circuit, a respective main light emitting element, a respective auxiliary light emitting element and a second respective auxiliary light emitting element in some embodiments according to the present disclosure. FIG. 9 illustrates an example in which n1=1, and n2=2. The structure of the respective main pixel driving circuit rmp and the respective auxiliary pixel driving circuit rap are the same as those depicted in FIG. 7. The second respective auxiliary pixel driving circuit rap' is configured to drive light emission in the second respective auxiliary light emitting element LE".

Referring to FIG. 9, in one example, the second respective auxiliary pixel driving circuit rap' is a 4T1C driving circuit. In some embodiments, the second respective auxiliary pixel driving circuit rap' includes a third driving transistor Td" having a source electrode coupled to a power supply voltage signal line Vdd; a third light emission control transistor Te" having a gate electrode coupled to a light emission control signal line em(n), a source electrode coupled to a drain electrode of the third driving transistor Td", and a drain electrode coupled to the anode of a second respective auxiliary light emitting element LE" of the n2 number of auxiliary light emitting elements; a switching transistor Ts' having a source electrode coupled to a first driving transistor Td of the respective main pixel driving circuit rmp and a first capacitor electrode Ce1 of a first storage capacitor Cst of the respective main pixel driving circuit rmp, and a drain electrode coupled to a gate electrode of the third driving transistor Td" of the second respective auxiliary pixel driving circuit rap'; a control transistor Tc' having a gate electrode coupled to a gate line GL(n), a source electrode coupled to a second control signal line CSL', and a drain electrode coupled to a gate electrode of the switching transistor Ts'; a third storage capacitor Cst" having a first capacitor electrode Ce1" coupled to the gate electrode of the switching transistor Ts' and the drain electrode of the control transistor Tc', and a second capacitor electrode Ce2" coupled to a constant voltage supply line Vss.

In some embodiments, a total number of control signal lines configured to transmit signals to the respective subpixel is n2. Light emission in the n2 number of auxiliary light emitting elements can be independently controlled with respect to each individual auxiliary light emitting element. Each of the n2 number of auxiliary light emitting elements can be turned on or off independently, depending on the individual control signal ($CSL_1$, . . . , $CSL_i$, . . . , $CSL_{n2}$, 1≤i≤n2) transmitted to the individual auxiliary pixel driving circuit. When the i-th control signal provided by $CSL_i$ is a turning-on signal, the same voltage signal (Vdd+Vth+Vss−DL(n)) is transmitted to the gate electrode of the driving transistor in the i-th auxiliary pixel driving circuit, thereby turning on the driving transistor in the i-th auxiliary pixel driving circuit. When the i-th control signal provided by $CSL_i$ is a turning-off signal, the gate electrode of the driving transistor in the i-th auxiliary pixel driving circuit is configured not to receive the same voltage signal, and the driving transistor in the i-th auxiliary pixel driving circuit is turned off.

In some embodiments, gate electrodes of second driving transistors in the n2 number of auxiliary pixel driving circuits and gate electrodes of first driving transistors in the n1 number of main pixel driving circuits are commonly coupled to the N1 node. The display method includes providing a same voltage signal (Vdd+Vth+Vss−DL(n)) to the gate electrodes of second driving transistors in the n2 number of auxiliary pixel driving circuits and the gate electrodes of first driving transistors in the n1 number of main pixel driving circuits.

In some embodiments, the data signal for the respective subpixel is provided only to the respective main pixel driving circuit rmp, but not to the n2 number of auxiliary pixel driving circuits. Specifically, the data signal for the respective subpixel is provided to the source electrode of the second transistor T2 in the respective main pixel driving circuit rmp. In some embodiments, the display method includes providing a data signal to the respective main pixel driving circuit rmp configured to drive light emission in the respective main light emitting element LE, without providing the data signal to the n2 number of auxiliary pixel driving circuits configured to drive light emission in the n2 number of auxiliary light emitting elements.

In some embodiments, a same light emission control signal is provided to a first light emission control transistor in the respective main pixel driving circuit and second light emission control transistors in the n2 number of auxiliary pixel driving circuits.

In some embodiments, a same gate scanning signal is provided to a data write transistor in the respective main pixel driving circuit and to control transistors in the n2 number of auxiliary pixel driving circuits.

The n1 number of main light emitting elements and the n2 number of auxiliary light emitting elements may have various appropriate areas. In one example, the n1 number of main light emitting elements and the n2 number of auxiliary light emitting elements have a same uniform area. In another example, a respective one of the n1 number of main light emitting elements has an area greater than a respective one of the n2 number of auxiliary light emitting elements. In another example, a respective one of the n1 number of main light emitting elements has an area smaller than a respective one of the n2 number of auxiliary light emitting elements.

Accordingly, in some embodiments, the display method includes providing a display panel comprising a plurality of subpixels, a respective subpixel of the plurality of subpixels comprising n1 number of main light emitting areas and n2 number of auxiliary light emitting areas, n1≥1, and n2≥1. Optionally, for displaying a first frame of image, controlling light emission of the respective subpixel to be limited in the n1 number of main light emitting areas and m number of the n2 number of auxiliary light emitting areas, 0≤m≤n2. Optionally, for displaying a second frame of image, controlling light emission of the respective subpixel to be limited in the n1 number of main light emitting areas and m' number of the n2 number of auxiliary light emitting areas, 0≤m'K≥n2, and m≠m'.

In some embodiments, for displaying the first frame of image in a first mode, the light emission of the respective subpixel is limited in the n1 number of main light emitting areas, m=0. Optionally, for displaying the second frame of image in a second mode, the light emission of the respective subpixel is limited in the n1 number of main light emitting areas and the n2 number of auxiliary light emitting areas, m'=n2.

In some embodiments, in the first mode, at least a portion of the display panel comprising the respective subpixel is configured to display a monochromatic image, or the first frame of image has a high contrast compared to a frame of image in an adjacent subpixel. Optionally, in the second mode, at least a portion of the display panel comprising the respective subpixel is configured to display a color image.

In some embodiments, the display method further includes, for displaying a third frame of image in a third mode, controlling light emission of the respective subpixel to be limited in the n1 number of main light emitting areas and m" number of the n2 number of auxiliary light emitting areas, 1<m"<n2, and m<m"<m'.

In another aspect, the present disclosure provides a light emitting substate having a plurality of subpixels. In some embodiments, a respective subpixel of the plurality of subpixels includes n1 number of main light emitting elements; n1 number of main pixel driving circuits configured to drive light emission in the n1 number of main light emitting elements; n2 number of auxiliary light emitting elements; and n2 number of auxiliary pixel driving circuits configured to drive light emission in the n2 number of auxiliary light emitting elements. Optionally, n1≥1, and n2≥1. Optionally, n1=1, and n2=1. Optionally, a respective main pixel driving circuit of the n1 number of main pixel driving circuits comprises a first storage capacitor, a first driving transistor, a first light emission control transistor, and a compensation subcircuit. Optionally, a respective auxiliary pixel driving circuit of the n2 number of auxiliary pixel driving circuits comprises a second storage capacitor, a second driving transistor, a second light emission control transistor, and a selection subcircuit. Optionally, threshold voltage levels of the first driving transistor and the second driving transistor are substantially the same.

Referring to FIG. 7, in some embodiments, a gate electrode of a second driving transistor Td' in a respective auxiliary pixel driving circuit rap of the n2 number of auxiliary pixel driving circuits and a gate electrode of a first driving transistor Td in a respective main pixel driving circuit rmp of the n1 number of main pixel driving circuits are coupled to a same node (the N1 node). Optionally, gate electrodes of first driving transistors in the n1 number of main pixel driving circuits and gate electrodes of second driving transistors in the n2 number of auxiliary pixel driving circuits are commonly coupled to the same node. In some embodiments, the respective main pixel driving circuit includes a first storage capacitor Cst comprising a first capacitor electrode Ce1 coupled to the same node.

In some embodiments, a gate electrode of the first driving transistor Td and a first capacitor electrode Ce1 of the first storage capacitor Cst are connected to a first node N1. Optionally, a gate electrode of the second driving transistor Td' and a first capacitor electrode Ce1' of the second storage capacitor Cst' are connected to the first node N1 through the switching transistor Ts.

In some embodiments, the respective auxiliary pixel driving circuit rap includes a switching transistor Ts coupled to the gate electrode of the second driving transistor Td' of the respective auxiliary pixel driving circuit rap, and coupled to the same node (the N1 node). Optionally, the switching transistor Ts is configured to control the gate electrode of the second driving transistor Td' of the respective auxiliary pixel driving circuit rap to electrically connect with, or disconnect from, the same node.

In some embodiments, the respective auxiliary pixel driving circuit rap includes a control transistor Tc coupled to the switching transistor Ts of the respective auxiliary pixel driving circuit rap. A source electrode of the control transistor Tc of the respective auxiliary pixel driving circuit rap is coupled to a control signal line CSL. A drain electrode of the control transistor Tc of the respective auxiliary pixel driving circuit rap is coupled to the gate electrode of the switching transistor Ts of the respective auxiliary pixel driving circuit rap. A gate electrode of the control transistor Tc of the respective auxiliary pixel driving circuit rap is coupled to a gate line GL(n). The gate electrode of the control transistor Tc of the respective auxiliary pixel driving circuit rap is provided with a same gate scanning signal provided to a data write transistor (e.g., T2) in the respective main pixel driving circuit rmp.

In some embodiments, the control signal line CSL is configured to provide a control signal. When the control signal is a turning-on signal, the switching transistor Ts is turned on to allow the gate electrode of the second driving transistor Td' in the respective auxiliary pixel driving circuit rap and the gate electrode of the first driving transistor Td in the respective main pixel driving circuit rmp receive a same voltage signal at the same node. When the control signal is a turning-off signal, the switching transistor Ts is turned off to disconnect the gate electrode of the second driving transistor Td' in the respective auxiliary pixel driving circuit rap from the same node.

In some embodiments, the light emitting substrate includes n2 number of control signal lines configured to transmit control signals to the n2 number of auxiliary pixel driving circuits, independently. Each of the n2 number of control signal lines ($CSL_1$, . . . , $CSL_i$, . . . , $CSL_{n2}$, 1≤i≤n2) can independently transmit an individual control signal to an individual auxiliary pixel driving circuit. Each of the n2 number of auxiliary light emitting elements can be turned on or off independently, depending on the individual control signal ($CSL_1$, . . . , $CSL_i$, . . . , $CSL_{n2}$, 1≤i≤n2) transmitted to the individual auxiliary pixel driving circuit. Light emission in the n2 number of auxiliary light emitting elements can be independently controlled with respect to each individual auxiliary light emitting element. When the i-th control signal provided by $CSL_i$ is a turning-on signal, the same voltage signal (Vdd+Vth+Vss−DL(n) is transmitted to the gate electrode of the driving transistor in the i-th auxiliary pixel driving circuit, thereby turning on the driving transistor in the i-th auxiliary pixel driving circuit. When the i-th control signal provided by $CSL_i$ is a turning-off signal, the gate electrode of the driving transistor in the i-th auxiliary pixel driving circuit is configured not to receive the same voltage signal, and the driving transistor in the i-th auxiliary pixel driving circuit is turned off.

In some embodiments, the respective auxiliary pixel driving circuit rap further includes a second storage capacitor Cst' comprising a first capacitor electrode Ce1' and a second capacitor electrode Ce2'. The first capacitor electrode Ce1' of the second storage capacitor Cst' is coupled to the gate electrode of the switching transistor Ts and to the drain electrode of the control transistor Tc; and the second capacitor electrode Ce2' of the second storage capacitor Cst' is coupled to a constant voltage supply line Vss.

In some embodiments, the respective main pixel driving circuit rmp includes a compensation subcircuit CSC. Optionally, the compensation subcircuit CSC includes a first transistor T1 having a gate electrode coupled to a reset control signal line rst(n), a source electrode coupled to a drain electrode of the first driving transistor Td, and a drain electrode coupled to the gate electrode of the first driving transistor Td and the first capacitor electrode Ce1 of the storage capacitor Cst; a second transistor T2 having a gate electrode coupled to a gate line GL(n), a source electrode coupled to a data line DL(n), and a drain electrode coupled to the second capacitor electrode Ce2 of the storage capacitor Cst; a third transistor T3 having a gate electrode coupled to a light emission control signal line em(n), a source electrode coupled to a constant voltage supply line Vss, and a drain electrode coupled to the second capacitor electrode Ce2 of the storage capacitor Cst and the drain electrode of the second transistor T2; and a fourth transistor T4 having a gate electrode coupled to a reset control signal line rst(n), a source electrode coupled to the constant voltage supply line Vss, and a drain electrode coupled to an anode of a respective main light emitting element LE of the n1 number of main light emitting elements.

In some embodiments, the respective auxiliary pixel driving circuit rap shares the compensation subcircuit CSC with the respective main pixel driving circuit rmp. In some embodiments, threshold voltage levels of the first driving transistor Td and the second driving transistor Td' are substantially the same. Optionally, a ratio of a channel width to a channel length of the active layer in the first driving transistor Td and a ratio of a channel width to a channel length of the active layer in the second driving transistor Td' are substantially the same. In one example, the first driving transistor Td and the second driving transistor Td' are fabricated in the light emitting substrate so that they are proximal to each other, to ensure their threshold voltage levels are substantially the same.

In some embodiments, the respective auxiliary pixel driving circuit rap includes a selection subcircuit SSC. Optionally, the selection subcircuit SSC includes a switching transistor Ts having a source electrode coupled to a first driving transistor Td of the respective main pixel driving circuit rmp and a first capacitor electrode Ce1 of a first storage capacitor Cst of the respective main pixel driving circuit rmp, and a drain electrode coupled to a gate electrode of the second driving transistor Td' of the respective auxiliary pixel driving circuit rap; and a control transistor Tc having a gate electrode coupled to a gate line GL(n), a source electrode coupled to a control signal line CSL, and a drain electrode coupled to a gate electrode of the switching transistor Ts.

In some embodiments, the n1 number of main light emitting elements and the n2 number of auxiliary light emitting elements are configured to emit light of a same color. Optionally, the light of the same color has a wavelength in a range of 435 nm to 480 nm, e.g., 435 nm to 440 nm, 440 nm to 445 nm, 445 nm to 450 nm, 450 nm to 455 nm, 455 nm to 460 nm, 460 nm to 465 nm, 465 nm to 470 nm, 470 nm to 475 nm, or 475 nm to 480 nm. In one example, the light of the same color has a wavelength in a range of 450 nm to 460 nm.

In some embodiments, a respective main light emitting element of the n1 number of main light emitting elements has a first light emitting area; and a respective auxiliary light emitting element of the n2 number of auxiliary light emitting elements has a second light emitting area. Optionally, the first light emitting area is greater than the second light emitting area.

In some embodiments, the n1 number of main light emitting elements has a first combined light emitting area; and the n2 number of auxiliary light emitting elements has a second combined light emitting area. Optionally, the first combined light emitting area is greater than the second combined light emitting area.

In another aspect, the present invention provides a display panel. In some embodiments, the display panel includes the light emitting substrate described herein or fabricated by a method described herein, and a color filter. Referring to FIG. 3, FIG. 4, and FIG. 6, the display panel in some embodiments further includes a color filter comprising a plurality of color filter blocks CFB. An orthographic projection of a respective color filter block of the plurality of color filter blocks CFB on a base substrate BS at least partially overlaps with an orthographic projection of the n1 number of main light emitting elements on the base substrate BS and at least partially overlaps with an orthographic projection of the n2 number of auxiliary light emitting elements on the base substrate BS.

Referring to FIG. 3, FIG. 4, and FIG. 6, the display panel in some embodiments further includes a first encapsulating layer EN1 encapsulating the plurality of light emitting elements, and a second encapsulating layer EN2 encapsulating the plurality of color filter blocks CFB.

Referring to FIG. 3, FIG. 4, and FIG. 6, the display panel in some embodiments further includes a unitary cathode CD extending throughout the plurality of subpixels.

Figure 10:
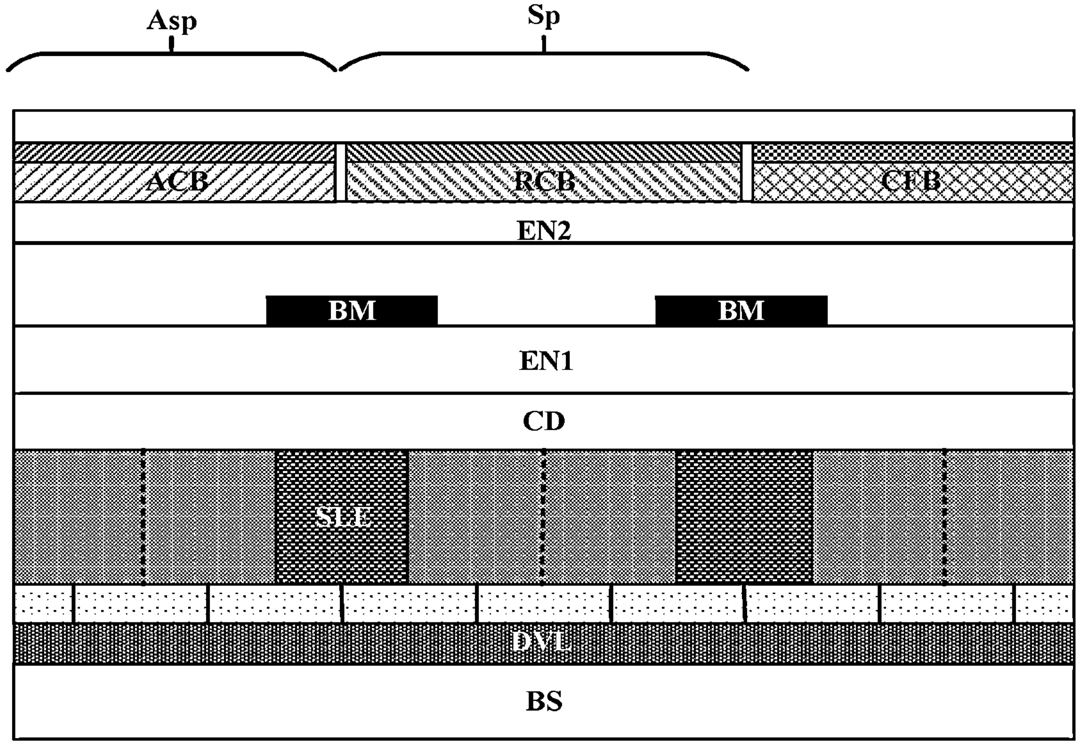
FIG. 10 is a cross-sectional view of a light emitting substrate in some embodiments according to the present disclosure.

In some embodiments, one or more auxiliary light emitting elements may be shared by two adjacent color filter blocks of the plurality of color filter blocks CFB. FIG. 10 is a cross-sectional view of a light emitting substrate in some embodiments according to the present disclosure. Referring to FIG. 10, the light emitting substrate further includes a shared light emitting element SLE and a shared pixel driving circuit that are shared between the respective subpixel Sp and an adjacent subpixel Asp. The shared pixel driving circuit is configured to drive light emission in the shared light emitting element SLE. An orthographic projection of the shared light emitting element SLE on a base substrate BS at least partially overlaps with an orthographic projection of a respective color filter block RCB of the plurality of color filter blocks CFB on a base substrate BS, and at least partially overlaps with an adjacent color filter block ACB of the plurality of color filter blocks CFB on a base substrate BS. The respective color filter block RCB and the adjacent color filter block ACB are adjacent to each other. The respective color filter block RCB corresponds to the respective subpixel Sp, and the adjacent color filter block ACB corresponds to the adjacent subpixel Asp.

In one example, the shared pixel driving circuit is coupled to a respective main pixel driving circuit in the respective subpixel Sp, a gate electrode of a driving transistor in the shared pixel driving circuit is coupled to a gate electrode of a first driving transistor in the main pixel driving circuit in the respective subpixel Sp.

In another example, the shared pixel driving circuit is coupled to a main pixel driving circuit in the adjacent subpixel Asp, a gate electrode of a driving transistor in the shared pixel driving circuit is coupled to a gate electrode of a first driving transistor in the main pixel driving circuit in the adjacent subpixel Asp.

Figure 11:
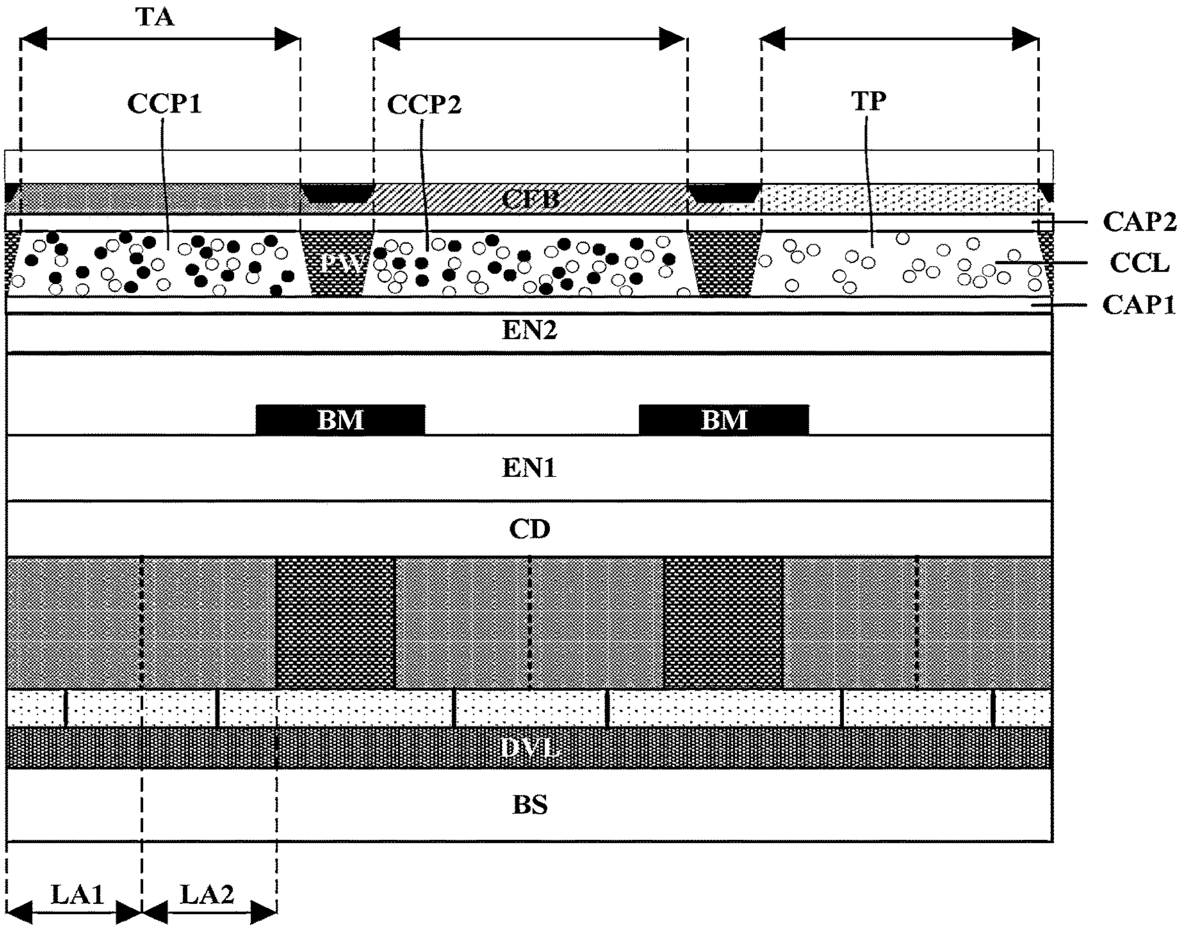
FIG. 11 is a schematic diagram illustrating the structure of a display panel in some embodiments according to the present disclosure.

FIG. 11 is a schematic diagram illustrating the structure of a display panel in some embodiments according to the present disclosure. Referring to FIG. 11, the color filter in some embodiments includes a plurality of color filter blocks CFB in a plurality of light transmittance areas TA, respectively. The n1 number of main light emitting elements have first light emitting areas LA1. The n2 number of auxiliary light emitting elements have second light emitting areas LA2. In some embodiments, a respective light transmittance area of the plurality of light transmittance areas TA at least partially overlaps with first light emitting areas of the n1 number of main light emitting elements, and at least partially overlaps with second light emitting areas of the n2 number of auxiliary light emitting elements.

In some embodiments, the display panel further includes a color conversion layer CCL. Optionally, the color conversion layer CCL includes a plurality of color conversion blocks of a first color CCP1, a plurality of color conversion blocks of a second color CCP2, and a plurality of light transmissive blocks, and optionally, a plurality of light transmissive blocks TP. In one example, the first color is a red color, the second color is a green color. The plurality of light transmissive blocks TP do not convert light into a different wavelength. In another example, the plurality of light transmissive blocks TP correspond to blue subpixels.

In some embodiments, the display panel includes a first capping layer CAP1 on the light emitting substrate; a color conversion layer CCL on a side of the first capping layer CAP1 away from the light emitting substrate; and a second capping layer CAP2 on a side of the color conversion layer CCL away from the first capping layer CAP1. Optionally, the color filter is on a side of the second capping layer CAP2 away from the color conversion layer CCL. The first capping layer CAP1 and the second capping layer CAP2 may be made of an inorganic insulating material such as silicon dioxide, silicon nitride, and silicon oxynitride.

Figure 12A:
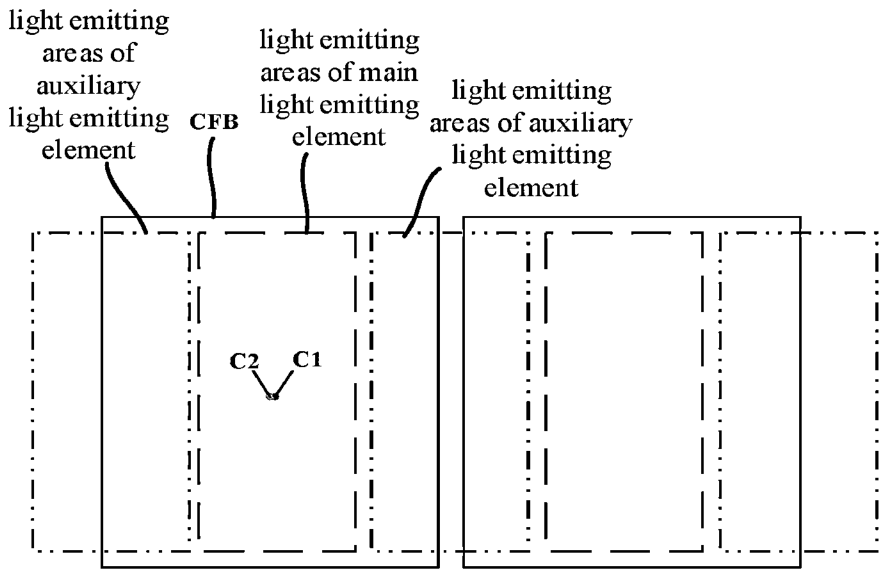
FIG. 12A is a plan view of a color filter and light emitting elements in some embodiments according to the present disclosure.

FIG. 12A is a plan view of a color filter and light emitting elements in some embodiments according to the present disclosure. Referring to FIG. 12A, a respective color filter block of the plurality of color filter blocks CFB is in a respective light transmittance area of the plurality of light transmittance areas (e.g., "TA" in FIG. 11). In some embodiments, a respective light transmittance area of the plurality of light transmittance areas at least partially overlaps with light emitting areas of the n1 number of main light emitting elements, and at least partially overlaps with light emitting areas of the n2 number of auxiliary light emitting elements. Optionally, the respective light transmittance area of the plurality of light transmittance areas completely covers light emitting areas of the n1 number of main light emitting elements, and at least partially overlaps with light emitting areas of the n2 number of auxiliary light emitting elements.

In some embodiments, an orthographic projection of a respective color filter block of the plurality of color filter blocks CFB on a base substrate at least partially overlaps with an orthographic projection of the n1 number of main light emitting elements on the base substrate, and at least partially overlaps with an orthographic projection of the n2 number of auxiliary light emitting elements on the base substrate. Optionally, the orthographic projection of a respective color filter block of the plurality of color filter blocks CFB on the base substrate completely covers an orthographic projection of the n1 number of main light emitting elements on the base substrate, and at least partially overlaps with the orthographic projection of the n2 number of auxiliary light emitting elements on the base substrate.

In some embodiments, a center C1 of an orthographic projection of the n1 number of main light emitting elements on a base substrate substantially overlaps with a center C2 of an orthographic projection of a respective color filter block of the plurality of color filter blocks on the base substrate. As used herein, the term "substantially overlap" refers to that two points (e.g., "centers") are spaced apart by no more than 1000 μm, e.g., no more than 900 μm, no more than 800 μm, no more than 700 μm, no more than 600 μm, no more than 500 μm, no more than 400 μm, no more than 300 μm, no more than 200 μm, no more than 100 μm, no more than 90 μm, no more than 80 μm, no more than 70 μm, no more than 60 μm, no more than 50 μm, no more than 40 μm, no more than 30 μm, no more than 20 μm, no more than 10 μm, no more than 5 μm, no more than 4 μm, no more than 3 μm, no more than 2 μm, or no more than 1 μm.

Figure 12B:
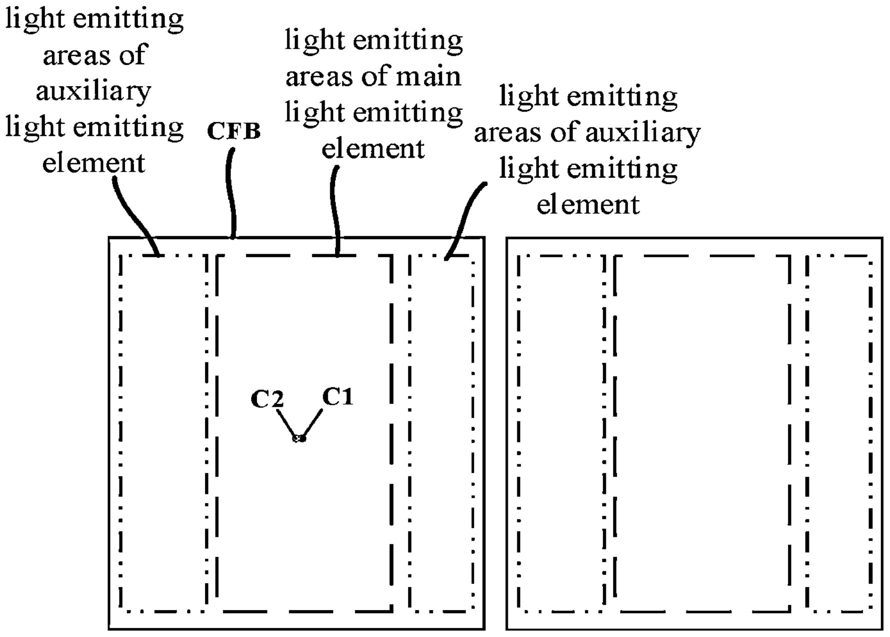
FIG. 12B is a plan view of a color filter and light emitting elements in some embodiments according to the present disclosure.

FIG. 12B is a plan view of a color filter and light emitting elements in some embodiments according to the present disclosure. Referring to FIG. 12B, a respective light transmittance area of the plurality of light transmittance areas completely covers light emitting areas of the n1 number of main light emitting elements, and completely covers light emitting areas of the n2 number of auxiliary light emitting elements. Optionally, an orthographic projection of a respective color filter block of the plurality of color filter blocks CFB on a base substrate completely covers an orthographic projection of the n1 number of main light emitting elements on the base substrate, and completely covers an orthographic projection of the n2 number of auxiliary light emitting elements on the base substrate. Optionally, a center C1 of an orthographic projection of the n1 number of main light emitting elements on a base substrate substantially overlaps with a center C2 of an orthographic projection of a respective color filter block of the plurality of color filter blocks on the base substrate. In FIG. 12B, a respective light emitting area of a respective main light emitting element is greater than a respective light emitting area of a respective auxiliary light emitting element.

Figure 12C:
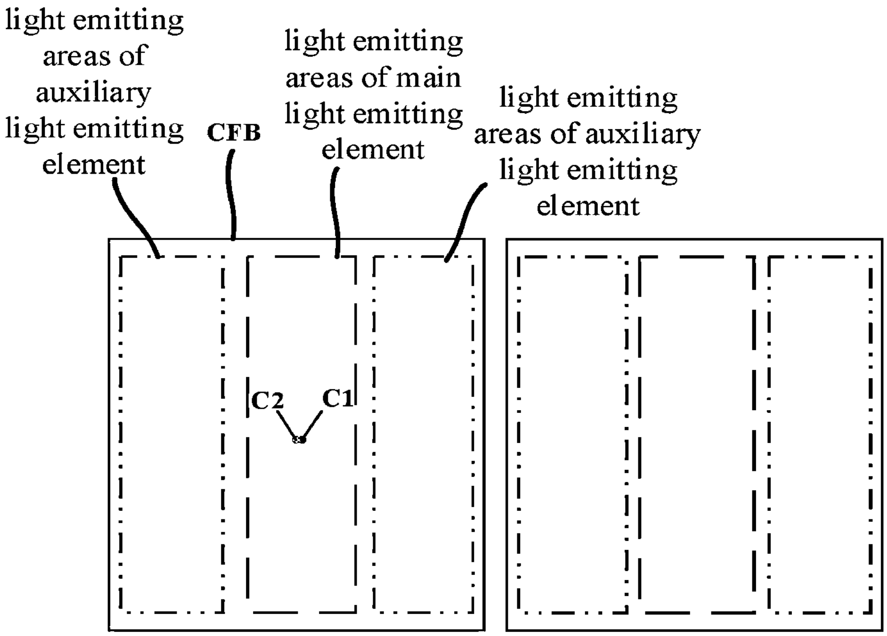
FIG. 12C is a plan view of a color filter and light emitting elements in some embodiments according to the present disclosure.

FIG. 12C is a plan view of a color filter and light emitting elements in some embodiments according to the present disclosure. Referring to FIG. 12C, a respective light emitting area of a respective main light emitting element is substantially the same as a respective light emitting area of a respective auxiliary light emitting element.

As used herein, the term "center" refers to, for example, a geometric center (particularly for a regular shape), an approximate geometric center, an equivalent center such as a center of mass or a center of gravity (particularly for an irregular shape).

In another aspect, the present invention provides a display apparatus, including the light emitting substrate described herein or fabricated by a method described herein, and one or more integrated circuits connected to the light emitting substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In some embodiments, the display apparatus includes one or more processors configured to determine a display mode for a respective subpixel of the plurality of subpixels in the display apparatus. In some embodiments, the one or more processors are configured to receive data signals for image display in the display panel from a printed circuit, the one or more processors are further configured to determine whether or not at least a portion of the display panel comprising the respective subpixel is configured to display a monochromatic image, based on the data signals. Optionally, upon determination that at least a portion of the display panel comprising the respective subpixel is configured to display a monochromatic image, the one or more processors is configured to transmit one or more signals to the respective subpixel, controlling light emission of the respective subpixel to be limited in the n1 number of main light emitting elements and m number of the n2 number of auxiliary light emitting elements, $0 \leq m \leq n2$.

In some embodiments, the one or more processors are configured to receive data signals for a frame of image, the one or more processors are further configured to determine whether or not a first frame of image of the respective subpixel has a high contrast compared to a frame of image in an adjacent subpixel, based on the data signals. Optionally, upon determination that the first frame of image of the respective subpixel has a high contrast compared to the frame of image in an adjacent subpixel, the one or more processors is configured to transmit one or more signals to the respective subpixel, controlling light emission of the respective subpixel to be limited in the n1 number of main light emitting elements and m number of the n2 number of auxiliary light emitting elements, $0 \leq m \leq n2$.

In some embodiments, the one or more processors are configured to receive data signals for a frame of image, the one or more processors are further configured to determine whether or not at least a portion of the display panel comprising the respective subpixel is configured to display a color image. Optionally, upon determination that at least a portion of the display panel comprising the respective subpixel is configured to display a color image, the one or more processors is configured to transmit one or more signals to the respective subpixel, controlling light emission of the respective subpixel to be limited in the n1 number of main light emitting elements and m' number of the n2 number of auxiliary light emitting elements, 0≤m'≤n2, and m≠m'.

In some embodiments, the one or more processors are configured to receive data signals for a frame of image, the one or more processors are further configured to transmit one or more signals to the respective subpixel, controlling light emission of the respective subpixel to be limited in the n1 number of main light emitting elements and m" number of the n2 number of auxiliary light emitting elements, 1<m"<n2, and m<m"<m'.

In another aspect, the present invention provides a method of fabricating a light emitting substrate. In some embodiments, the method includes forming a plurality of subpixels. In some embodiments, forming a respective subpixel of the plurality of subpixels includes forming n1 number of main light emitting elements; forming n1 number of main pixel driving circuits configured to drive light emission in the n1 number of main light emitting elements; forming n2 number of auxiliary light emitting elements; and forming n2 number of auxiliary pixel driving circuits configured to drive light emission in the n2 number of auxiliary light emitting elements. Optionally, n1≥1, and n2≥1. Optionally, a gate electrode of a second driving transistor in a respective auxiliary pixel driving circuit of the n2 number of auxiliary pixel driving circuits and a gate electrode of a first driving transistor in a respective main pixel driving circuit of the n1 number of main pixel driving circuits are coupled to a same node.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting substrate, comprising a plurality of subpixels;

wherein a respective subpixel of the plurality of subpixels comprises:

n1 number of main light emitting elements;

n1 number of main pixel driving circuits configured to drive light emission in the nl number of main light emitting elements;

n2 number of auxiliary light emitting elements;

n2 number of auxiliary pixel driving circuits configured to drive light emission in the n2 number of auxiliary light emitting elements;

n1≥1,and n2≥1;

wherein a respective main pixel driving circuit of the n1 number of main pixel driving circuits comprises a first storage capacitor, a first driving transistor, a first light emission control transistor, and a compensation subcircuit;

wherein a respective auxiliary pixel driving circuit of the n2 number of auxiliary pixel driving circuits comprises a second storage capacitor, a second driving transistor, a second light emission control transistor, and a selection subcircuit;

wherein threshold voltage levels of the first driving transistor and the second driving transistor are substantially the same;

wherein the compensation subcircuit comprises:

a first transistor having a gate electrode coupled to a reset control signal line, a source electrode coupled to a drain electrode of the first driving transistor, and a drain electrode coupled to the gate electrode of the first driving transistor and a first capacitor electrode of the first storage capacitor;

a second transistor having a gate electrode coupled to a gate line, a source electrode coupled to a data line, and a drain electrode coupled to a second capacitor electrode of the first storage capacitor;

a third transistor having a gate electrode coupled to a light emission control signal line, a source electrode coupled to a constant voltage supply line, and a drain electrode coupled to the second capacitor electrode of the first storage capacitor and the drain electrode of the second transistor; and a fourth transistor having a gate electrode coupled to a reset control signal line, a source electrode coupled to the constant voltage supply line, and a drain electrode coupled to an anode of a respective main light emitting element of the nl number of main light emitting elements.

2. The light emitting substrate of claim 1, wherein the selection subcircuit comprises:

a switching transistor having a source electrode coupled to the first driving transistor of the respective main pixel driving circuit and a first capacitor electrode of the first storage capacitor of the respective main pixel driving circuit, and a drain electrode coupled to a gate electrode of the second driving transistor of the respective auxiliary pixel driving circuit; and a control transistor having a gate electrode coupled to a gate line, a source electrode coupled to a control signal line, and a drain electrode coupled to a gate electrode of the switching transistor.

3. The light emitting substrate of claim 2, wherein a gate electrode of the first driving transistor and the first capacitor electrode of the first storage capacitor are connected to a first node; and a gate electrode of the second driving transistor and a first capacitor electrode of the second storage capacitor are connected to the first node through the switching transistor.

4. The light emitting substrate of claim 1, wherein the n1 number of main light emitting elements and the n2 number of auxiliary light emitting elements are configured to emit light of a same color.

5. The light emitting substrate of claim 4, wherein the light of the same color has a wavelength in a range of 435 nm to 480 nm.

6. The light emitting substrate of claim 1, wherein a respective main light emitting element of the n1 number of main light emitting elements has a first light emitting area;

a respective auxiliary light emitting element of the n2 number of auxiliary light emitting elements has a second light emitting area; and the first light emitting area is greater than the second light emitting area.

7. The light emitting substrate of claim 1, wherein the respective auxiliary pixel driving circuit comprises a control transistor and a switching transistor;

a source electrode of the control transistor of the respective auxiliary pixel driving circuit is coupled to a control signal line;

a drain electrode of the control transistor of the respective auxiliary pixel driving circuit is coupled to the gate electrode of the switching transistor of the respective auxiliary pixel driving circuit;

a gate electrode of the control transistor of the respective auxiliary pixel driving circuit is coupled to a gate line; and the gate electrode of the control transistor of the respective auxiliary pixel driving circuit is provided with a same gate scanning signal provided to a data write transistor in the respective main pixel driving circuit.

8. A light emitting substrate, comprising a plurality of subpixels;

wherein a respective subpixel of the plurality of subpixels comprises:

n1 number of main light emitting elements;

n1 number of main pixel driving circuits configured to drive light emission in the n1 number of main light emitting elements;

n2 number of auxiliary light emitting elements;

n2 number of auxiliary pixel driving circuits configured to drive light emission in the n2 number of auxiliary light emitting elements;

$n1 \geq 1$, and $n2 \geq 1$;

wherein a respective main pixel driving circuit of the nl number of main pixel driving circuits comprises a first storage capacitor, a first driving transistor, a first light emission control transistor, and a compensation subcircuit;

wherein a respective auxiliary pixel driving circuit of the n2 number of auxiliary pixel driving circuits comprises a second storage capacitor, a second driving transistor, a second light emission control transistor, and a selection subcircuit;

wherein threshold voltage levels of the first driving transistor and the second driving transistor are substantially the same;

wherein the respective auxiliary pixel driving circuit comprises a control transistor and a switching transistor;

a source electrode of the control transistor of the respective auxiliary pixel driving circuit is coupled to a control signal line;

a drain electrode of the control transistor of the respective auxiliary pixel driving circuit is coupled to the gate electrode of the switching transistor of the respective auxiliary pixel driving circuit;

a gate electrode of the control transistor of the respective auxiliary pixel driving circuit is coupled to a gate line; and the gate electrode of the control transistor of the respective auxiliary pixel driving circuit is provided with a same gate scanning signal provided to a data write transistor in the respective main pixel driving circuit;

wherein the control signal line is configured to provide a control signal;

wherein, when the control signal is a turning-on signal, the switching transistor is turned on to allow the gate electrode of the second driving transistor in the respective auxiliary pixel driving circuit and the gate electrode of the first driving transistor in the respective main pixel driving circuit to receive a same voltage signal at the same node; and wherein when the control signal is a turning-off signal, the switching transistor is turned off to disconnect the gate electrode of the second driving transistor in the respective auxiliary pixel driving circuit from the same node.

9. The light emitting substrate of claim 7, wherein the second storage capacitor of the auxiliary pixel driving circuit comprises a first capacitor electrode and a second capacitor electrode;

the first capacitor electrode of the second storage capacitor is coupled to the gate electrode of the switching transistor and to the drain electrode of the control transistor; and the second capacitor electrode of the second storage capacitor is coupled to a constant voltage supply line.

10. A display panel, comprising the light emitting substrate of claim 1, and a color filter;

wherein the color filter comprises a plurality of color filter blocks in a plurality of light transmittance areas, respectively;

wherein a respective light transmittance area of the plurality of light transmittance areas at least partially overlaps with light emitting areas of the n1 number of main light emitting elements, and at least partially overlaps with light emitting areas of the n2 number of auxiliary light emitting elements.

11. The display panel of claim 10, wherein an orthographic projection of a respective color filter block of the plurality of color filter blocks on a base substrate completely covers an orthographic projection of the n1 number of main light emitting elements on the base substrate, and at least partially overlaps with an orthographic projection of the n2 number of auxiliary light emitting elements on the base substrate.

12. The display panel of claim 10, further comprising:

a first capping layer on the light emitting substrate;

a color conversion layer on a side of the first capping layer away from the light emitting substrate; and a second capping layer on a side of the color conversion layer away from the first capping layer;

wherein the color filter is on a side of the second capping layer away from the color conversion layer; and the color conversion layer comprises a plurality of color conversion blocks of a first color, a plurality of color conversion blocks of a second color, and a plurality of light transmissive block.

13. The display panel of claim 10, wherein a center of an orthographic projection of the n1 number of main light emitting elements on a base substrate substantially overlaps with a center of an orthographic projection of a respective color filter block of the plurality of color filter blocks on the base substrate.

14. A display apparatus, comprising the light emitting substrate of claim 1, and one or more integrated circuits connected to the light emitting substrate.

* * * * *